United States Patent [19]
Zimmerman et al.

[11] Patent Number: 6,016,523
[45] Date of Patent: Jan. 18, 2000

[54] I/O MODULAR TERMINAL HAVING A PLURALITY OF DATA REGISTERS AND AN IDENTIFICATION REGISTER AND PROVIDING FOR INTERFACING BETWEEN FIELD DEVICES AND A FIELD MASTER

[75] Inventors: Achim Zimmerman, Dietzenbach; Heinz Schaffner, Rödermark; Edgar Polly, Seligenstadt; Helmut Zimmermann, Hammersbach, all of Germany

[73] Assignee: Schneider Automation, Inc., North Andover, Mass.

[21] Appl. No.: 09/036,565

[22] Filed: Mar. 9, 1998

[51] Int. Cl.$^7$ .............................. G06F 13/00; G06F 3/00
[52] U.S. Cl. .............................. 710/63; 710/63; 710/129; 710/130
[58] Field of Search ................ 364/514 B, 424.01, 364/424.03; 340/517, 510, 511, 870; 710/130, 63, 73, 129

[56] References Cited

U.S. PATENT DOCUMENTS

| | | | |
|---|---|---|---|
| 4,725,819 | 2/1988 | Sasaki et al. | 340/517 |
| 5,442,170 | 8/1995 | Kreft et al. | 250/229 |
| 5,537,607 | 7/1996 | Ploger, III | 395/830 |
| 5,566,088 | 10/1996 | Herscher et al. | 364/514 B |
| 5,703,575 | 12/1997 | Krikpatrick | 340/870 |
| 5,857,192 | 1/1999 | Fitting | 707/10 |

FOREIGN PATENT DOCUMENTS

| | | |
|---|---|---|
| 0 542 657 A1 | 5/1993 | European Pat. Off. . |
| 4410 171 C1 | 4/1995 | Germany . |
| 196 15 093 A1 | 10/1997 | Germany . |
| 19615093A1 | 10/1997 | Germany . |

OTHER PUBLICATIONS

Terminal Block I/O (TIO) Addendum to Catalog Specifier's Guide—Groupe Schneider Back to the Roots by Dr. Luer Luetkens (non–translated article), pp. 32–35.

Primary Examiner—Thomas C. Lee
Assistant Examiner—Chun Cao
Attorney, Agent, or Firm—Larry I. Golden; Michael J. Femal

[57] ABSTRACT

An transfer body is provided for interfacing between field devices and a field master. One form of the transfer body is an input/output (IO) body. The IO body has a plurality of in-data registers for accepting data from the field devices, a plurality of out-data registers for sending data to field devices, and an identification register for identifying the data in relation to the field devices. The IO body also has an interface portion having an identification port communicating with the identification register, an in-data port communicating with the in-data registers, and an out-data port communicating with the out-data registers. The body can directly attach to and communicate with a plurality of different types of communications adapters through the interface portion for communication with a field master. The body can also directly attach to and communicate with a PLC type of field master through the interface portion. Each communications adapter is configured to directly attach to and communicate through the in-data port, the out-data port, and the identification port, and wherein each communications adapter is also configured to communicate with one or more types of field masters.

23 Claims, 29 Drawing Sheets

| PLACE IN THE FRAME | IN | OUT |
|---|---|---|
| FIRST WORD (n) | | |
| | PROCESS INPUT | PROCESS OUTPUT |
| | | |
| (1) | STATUS | PARAMETER(S) |
| LAST WORD (0) | MESSAGE PASSING INPUT/OUTPUT ||

*Fig. 11*

EXAMPLE: ANALOGUE IO-BODY WITH 4 CHANNELS OUT

| | 15 0 |
|---|---|
| WORD 4 | CHANNEL 4    CH4 |
| WORD 3 | CHANNEL 3    CH3 |
| WORD 2 | CHANNEL 2    CH2 |
| WORD 1 | CHANNEL 1    CH1 |
| WORD 0 | PAR. CH4 \| PAR. CH3 \| PAR. CH2 \| PAR. CH1 |

*Fig. 12*

EXAMPLES FOR THE RELATIONSHIP BETWEEN A WORD
IN THE CYCLIC FRAME AND A PERIPHERAL IO-POINT:

DIGITAL IO-BODY WITH 32 OUT OR 32 IN

|  | IN OR OUT | |
|---|---|---|
|  | 15 | 0 |
| WORD 1 | IO-BIT 32 | IO-BIT 17 |
| WORD 0 | IO-BIT 16 | IO-BIT 1 |

ANALOG IO-BODY WITH 4 CHANNEL OUT
OR 4 CHANNEL IN

|  | IN OR OUT |
|---|---|
| WORD 3 | CHANNEL 4 |
| WORD 2 | CHANNEL 3 |
| WORD 1 | CHANNEL 2 |
| WORD 0 | CHANNEL 1 |

*Fig. 13*

ANALOG IO-BODY WITH 2 CHANNEL OUT AND 2 WORDS OF PARAMETER
4 CHANNEL IN AND 2 WORDS OF STATUS

|  | IN | OUT |
|---|---|---|
| WORD 5 | CHANNEL 4 | — |
| WORD 4 | CHANNEL 3 | — |
| WORD 3 | CHANNEL 2 | CHANNEL 2 |
| WORD 2 | CHANNEL 1 | CHANNEL 1 |
| WORD 1 | CHANNEL 2 | PARAMETER 2 |
| WORD 0 | CHANNEL 1 | PARAMETER 1 |

*Fig. 14*

FIRST BYTE OF IO-BODY IDENTIFICATION

BIT 7 6 5 4 3 2 1 0

| GROUP, | CODE OF IO-BODY | THE VALUE 0x00 IS RESEVERED FOR "NOT READY" CONDITION

0, CODE = 128 DIGITAL IO-BODIES
110, CODE = 32 ANALOG IO-BODIES
111, CODE = 32 MIXED ANALOG/DIGITAL IO-BODIES
100, CODE = 32 EXPERT IO-BODIES USING MESSAGE PASSING
101, CODE = 32 EXPERT IO-BODES NOT USING MESSAGE PASSING

*Fig. 15*

SECOND BYTE OF IO-BODY IDENTIFICATION

| BIT | 7 | 6 | 5 | 4 | 3 | 2 | 1 | 0 |
|---|---|---|---|---|---|---|---|---|
| | RUN | # STATUS WORDS | | | # PARAMETER WORDS | | | |

RUN                         INDICATES THE MEANING OF BIT 6 TO BIT 0

0: NUMBER OF WORDS OF STATUS AND PARAMETER

1: CURRENT STATE OF THE IO-BODY (SEE CHAPTER 4)

NUMBER OF STATUS WORDS      THE NUMBER OF STATUS WORDS OF THE IO-BODY INCLUDED IN THE CYCLIC FRAME
                            BETWEEN COM-ADAPTER AND IO-BODY, SENT FROM IO-BODY TO COM-ADAPTER

NUMBER OF PARAMETER WORDS   THE NUMBER OF PARAMETER WORDS FOR THE IO-BODY INCLUDED IN THE CYCLIC
                            FRAME BETWEEN COM-ADAPTER AND IO-BODY, SENT FROM COM-ADAPTER TO IO-BODY 0 x 00 NO STATUS, NOT PARAMETERS = > FORBIDDEN TO PLACE THE REGISTER
                            0 x FF FORBIDDEN
                            0 x *V1H <= V <= EH, NUMBER OF PARAMETER WORDS (0 TO 14)
                            0 x V*1H <= V <= 7H, NUMBER OF STATUS WORDS (0 TO 7)
                              H INDICATES A HEX VALUE
                              * INDICATES DO NOT CARE

*Fig. 16*

SIMPLE DIGITAL IO-BODY, 1 WORD IN, 1 WORD OUT,
NO STATUS OR PARAMETERS

STEP 4  D-IDENT:  | 1.ID-BYTE | n+1 | n-2 | n=3 |
                  | 0xxxxxxxb | 0x00 | 0x00 | 0xFF |   N-1=2 OUTPUT BYTE SHIFT REGISTER, NO PARAMETERS STEP 7  D-IN:  | n-1 | n-2 | n-3 |
               | 0x00 | 0x00 | 0xFF |   n-1=2 INPUT BYTE SHIFT REGISTER, NO STATUS

*Fig. 17*

SIMPLE DIGITAL IO-BODY, 0 WORD IN, 1 WORD OUT,
NO STATUS OR PARAMETERS

STEP 4  D-IDENT:  | 1.ID-BYTE | n=1 | n-2 | n=3 |
                  | 0xxxxxxxb | 0x00 | 0x00 | 0xFF |   N-1=2 OUTPUT BYTE SHIFT REGISTER, NO PARAMETERS STEP 7  D-IN:  | n=1 | n-2 | ---- | n-(MAX.+1) |
               | 0x00 | 0x00 | ---- | 0x00 |   0 INPUT SHIFT REGISTER

*Fig. 18*

COMPLEX ANALOG IO-BODY, 3 WORDS IN, 3 WORDS OUT,
2 WORDS STATUS, 1 WORDS PARAMETERS

STEP 4  D-IDENT:

| 1.ID-BYTE | n=1 | n=2 | n=3 | n=4 | n=5 | n=6 | n=7 | n=8 |
|---|---|---|---|---|---|---|---|---|
| 110xxxxxb | 0x21 | 0x00 | 0x00 | 0x00 | 0x00 | 0x00 | 0x00 | 0xFF |

N-2=6 OUTPUT BYTE SHIFT REGISTERS,
0X21->.1 WORD OF PARAMETER

STEP 7  D-IN:

| n=1 | n=2 | n=3 | n=4 | n=5 | n=6 | n=7 |
|---|---|---|---|---|---|---|
| 0x21 | 0x00 | 0x00 | 0x00 | 0x00 | 0x00 | 0xFF |

N-1=5 INPUT BYTE SHIFT REGISTERS,
0X21->2 WORD OF STATUS

*Fig. 19*

OUTBOUND DATA

BITS 15-12 NOT USED
BITS 11-10 OUTBOUND SQUENCE NUMBER
BITS 9-8 ECHO OF INBOUND SEQUENCE NUMBER
BITS 7-0 OUTBOUND DATA BYTE

INBOUND DATA

BITS 15-12 NOT USED
BITS 11-10 OUTBOUND SQUENCE NUMBER
BITS 9-8 INBOUND SEQUENCE NUMBER
BITS 7-0 INBOUND DATA BYTE

*Fig. 20*

SEQUENCE NUMBER

SINCE THERE IS NO NEED TO HAVE MORE THAN ONE UNACKNOWLEDGED MESSAGE FRAGMENT OUTSTANDING AT ANY TIME, THE SEQUENCE NUMBER DOES NOT NEED TO BE MORE THAN 1 BIT LONG. WE ALLOCATE 2 BITS IN ORDER TO ALLOW REPRESENTATION OF MESSAGE FRAMING AND ABORT IN ADDITION TO CHARACTER SEQUENCING

00 IDLE/END OF MESSAGE
01 IDLE/ABANDON MESSAGE
10 BODY OF MESSAGE
11 BODY OF MESSAGE

*Fig. 21*

STATE TRANSISTIONS:

```
00 --> 01    RESET - IGNORE
01 --> 00    COMPLETION OF RESET - IGNORE
0X --> 10    START OF MESSAGE
10 --> 11    CONTINUATION OF MESSAGE
11 --> 10    CONTINUATION OF MESSAGE
1X --> 00    END OF MESSAGE (NORMAL END - INTERPRET MESSAGE)
1X --> 01    END OF MESSAGE (ABANDON MESSAGE - USED TO RESET)
```

*Fig. 22*

| OUTBOUND BITS | INBOUND BITS | MEANING |
|---|---|---|
| 1111 11 00 00000000 | 1111 11 00 00000000 | |
| 5432 10 98 76543210 | 5432 10 98 76543210 | |
| ---- -- -- XXXXXXXX | ---- -- 00 00000000 | (INITIAL STATE) |
| 0000 00 00 00000011 | ---- -- 00 00000000 | (NEW REQUEST 03) |
| 0000 00 00 00000011 | ---- -- 10 00 XXXXXXXX | (ACK THE 03) |
| 0000 00 00 00000000 | ---- -- 10 00 XXXXXXXX | (NEXT BYTE 00) |
| 0000 00 00 00000000 | ---- -- 11 00 XXXXXXXX | (ACK THE 00) |
| 0000 00 00 00000000 | ---- -- 11 00 XXXXXXXX | (NEXT BYTE 00) |
| 0000 00 00 00000000 | ---- -- 10 00 XXXXXXXX | (ACK THE 00) |
| 0000 00 00 00000000 | ---- -- 10 00 XXXXXXXX | (NEXT BYTE 00) |
| 0000 00 00 00000001 | ---- -- 11 00 XXXXXXXX | (ACK THE 00) |
| 0000 00 00 00000001 | ---- -- 11 00 XXXXXXXX | (LAST BYTE 01) |
| ---- -- -- XXXXXXXX | ---- -- 00 10 00000011 | (ACK THE 01, NEW RESPONSE 03) |
| 0000 00 10 XXXXXXXX | ---- -- 00 10 00000011 | (ACT THE 03) |
| 0000 00 10 XXXXXXXX | ---- -- 00 11 00000010 | (NEXT BYTE 02) |
| 0000 00 11 XXXXXXXX | ---- -- 00 11 00000010 | (ACT THE 02) |
| 0000 00 11 XXXXXXXX | ---- -- 00 10 00010010 | (NEXT BYTE 12) |
| 0000 00 10 XXXXXXXX | ---- -- 00 10 00010010 | (ACT THE 12) |
| 0000 00 10 XXXXXXXX | ---- -- 00 00 00110100 | (LAST BYTE 34) |
| 0000 00 00 XXXXXXXX | ---- -- 00 00 00110100 | (ACK THE 34) |

- = NOT USED
X = DON'T CARE

*Fig. 23*

STATES DESCRIPTION

| | IDENTIFICATION BYTES | /IOERR | /RESOUT | INPUT VALUES AT INTERFACE | STATUS VALUE AT INTERFACE | PARAMETERS VALUE AT INTERFACE | OUTPUT VALUES AT INTERFACE | PROCESS OUTPUT VALUES |
|---|---|---|---|---|---|---|---|---|
| PW_RESET | 0 | ACTIVE | NON SIGNIFICANT | 0 | 0 | NON SIGNIFICANT | NON SIGNIFICANT | DEFAULT FALLBACK VALUES |
| PW_INIT | 0 | INACTIVE | NON SIGNIFICANT | 0 | 0 | NON SIGNIFICANT | NON SIGNIFICANT | DEFAULT FALLBACK VALUES |
| WD_INIT | 0 | ACTIVE | NON SIGNIFICANT | 0 | 0 | NON SIGNIFICANT | NON SIGNIFICANT | DEFAULT FALLBACK VALUES |
| WD_WAIT | <> 0 IDENTIFICATION MEANING | ACTIVE | NON SIGNIFICANT | 0 | 0 | NON SIGNIFICANT | NON SIGNIFICANT | DEFAULT FALLBACK VALUES |
| NON PARAMETERED FALLBACK | <> 0 IDENTIFICATION MEANING | INACTIVE | SIGNIFICANT | 0 | DEPENDS ON THE I/O-BOARD SPECIFICATION | 0 | NON SIGNIFICANT | DEFAULT FALLBACK VALUES |
| RUNNING | 2ND BYTE VALUE IS 10000001 | INACTIVE | SIGNIFICANT | PROCESS VALUES | PROCESS STATE <> 0 | <> 0 | NETWORK VALUES | NETWORK VALUES |
| PARAMETERED FALLBACK | <> 0 IDENTIFICATION MEANING | INACTIVE | SIGNIFICANT | PROCESS VALUES | DEPENDS ON THE I/O-BOARD SPECIFICATION | 0 | NON SIGNIFICANT | PARAMETERED FALLBACK VALUES |
| FAIL | 0 | ACTIVE | NON SIGNIFICANT | 0 | DEPENDS ON THE I/O-BOARD SPECIFICATION | NON SIGNIFICANT | NON SIGNIFICANT | DEFAULT FALLBACK VALUES |

*Fig. 26*

| SIGNAL | PIN | MEANING |
|---|---|---|
| D-OUT | 3 | SERIAL DATA FROM COM-ADAPTER OUT TO IO-BODY |
| D-IN | 6 | SERIAL DATA FROM IO-BODY INTO COM-ADAPTER |
| CLK | 5 | SYNCHRONOUS CLOCK FOR THE IO SHIFT REGISTER, POSITIVE EDGE CLOCKS THE DATA. |
| /LATCH IN | 7 | LATCH INPUT DATA SHIFT REGISTERS ON IO-BODY |
| LATCH OUT | 8 | LATCH OUTPUT DATA SHIFT REGISTERS ON IO-BODY |
| D-IDENT | 4 | SERIAL IDENT DATA INPUT FROM IO-BODY |
| IO-ERR | 9 | IO ERROR CAN BE SIGNALED ASYNCHRONOUSLY BY THE IO BODY; GLOBAL ERROR SIGNAL; DETAILED ERROR INFORMATION VIA DATA; LOW ACTIVE AS LONG AS THE ERROR IS ACTIVE. |
| /RESOUT | 10 | ASYNCHRONOUS CLEAR OF OUTPUT DATA SHIFT REGISTERS ON THE IO-BODY. |
| GND (2*) | 2, 11 | LOGIC GROUND |
| VCC (2*) | 1, 12 | +5v SUPPLY VOLTAGE TO BE GENERATED ON IO-BODY. |

*Fig. 28*

SIGNAL LOAD (CAPACITANCE CL):

| CLK | 20 pF TO 60 pF |
|---|---|
| ALL OTHER SIGNALS | 70 pF TO 130 pF |

*Fig. 30*

/RESOUT DURING POWER UP/DOWN:

| VCC RANGE | /RESOUT LEVEL |
|---|---|
| 0V ... 2.0V | NOT DEFINED |
| > 2.0V ... 4.5V | LOW (ACTIVE) |
| 4.5V ... 4.75V | LOW OR NORMAL OPERATION |
| > 4.75V. | NORMAL OPERATION |

*Fig. 32*

SIGNAL LEVELS:

| COMMENT | MIN. | MAX | CONDITIONS |
|---|---|---|---|
| OUTPUT LOW VOLTAGE VOL | | 0.4 V | IO = 20 μA |
| OUTPUT HIGH VOLTAGE VOH | 0.8*VCC | | IO = 20 μA |
| OUTPUT HIGH VOLTAGE VOH | 0.8*VCC | | IO = 1 mA |
| FOR THE IO-ERR SIGNAL | | | |

Fig. 31

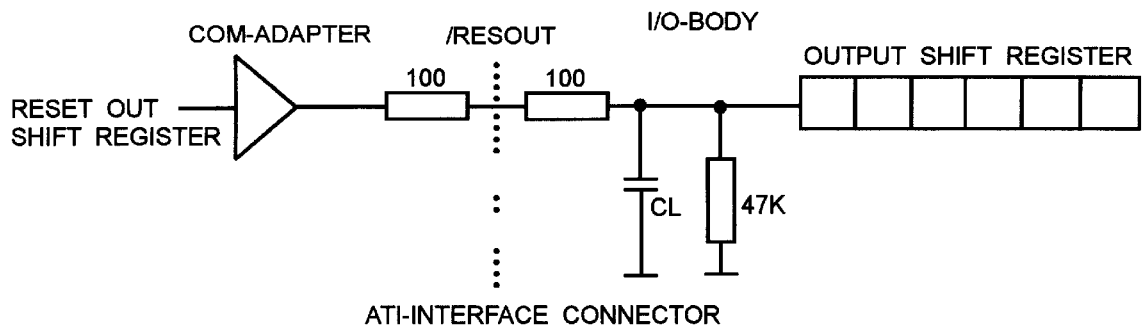
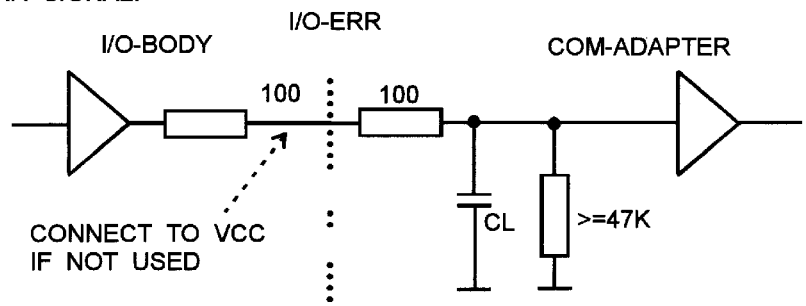
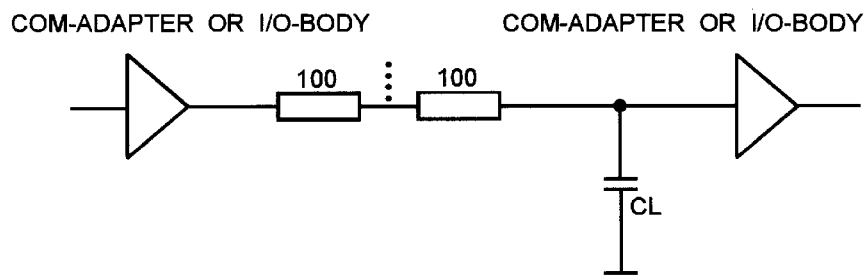
Fig. 33

|  |  | MIN. | MAX. | UNIT |
|---|---|---|---|---|
| /RESOUT PULSE WIDTH | t1 | 2 |  | µs |
| /RESOUT INACTIVE TO CLK | t2 | 200 |  | ns |
| D-OUT SETUP TO CLK | t3 | 100 |  | ns |
| D-OUT HOLD FROM CLK | t4 | 20 |  | ns |
| CLK PERIOD | t5 | 200 |  | ns |
| CLK HIGH | t6 | 100 |  | ns |
| CLK LOW | t7 | 100 |  | ns |
| CLK TO LATCH-OUT | t8 | 100 |  | ns |
| LATCH-OUT INACTIVE TO CLK | t9 | 200 |  | ns |
| LATCH-OUT HIGH | t10 | 100 |  | ns |
| /LATCH-IN LOW | t20 | 100 |  | ns |
| /LATCH-IN INACTIVE TO CLK | t21 | 200 |  | ns |
| /LATCH-IN TO DATA DELAY | t22 |  | 200 | ns |
| CLK TO DATA DELAY | t23 |  | 100 | ns |
| TRANSITION TIME CLK |  |  | 20 | ns |
| TRANSITION TIME /RESOUT |  |  | 500 | ns |
| TRANSITION TIME (ALL OTHER SIGNALS) |  |  | 50 | ns |
| IO-ERR LOW TIME |  | 270*[1] | *[2] | ms |

*[1] ONLY IF IT SHOULD BE GUARANTEED, THAT THE IO-ERROR HAS TO BE DETECTED.

*[2] A MAXIMUM VALUE ONLY FOR COMPLEX IO-BODIES, WHEN WATCHDOG EXPIRES OR FOR POWER-RESET.

I/O MODULAR TERMINAL HAVING A PLURALITY OF DATA REGISTERS AND AN IDENTIFICATION REGISTER AND PROVIDING FOR INTERFACING BETWEEN FIELD DEVICES AND A FIELD MASTER

TECHNICAL FIELD

The present invention generally relates to an industrial automation system for monitoring and controlling field devices within a distributed digital control system. More specifically, the present invention relates to input and output terminal interfaces for communication between input and output field devices, and programmable logic controllers (PLCs), and for communication between in input and output field devices, and other field master devices, such as a host device.

BACKGROUND OF THE INVENTION

Within industrial automation systems market, there are various types of communications network protocols which were developed for products, such as PLCs, to run on the products to be networked together, and for the field devices to be monitored and controlled from various locations within the particular automation systems. Thus, various types of input and output communications devices have been produced to communicate within the various types of communications protocols for the various types of communications networks for the automation systems. For example, FIG. 2 shows various types of communications protocols, such as Interbus-S, Profibus DP, Modbus Plus, Echelon, Seriplex, CAN DeviceNet, CAN SDS, and CANCAL, to name only a few. An additional protocol is FIPIO. Each of these various communications network types require specific input and output devices for communication with the input and output field devices based on the various types of communications protocols each having specific and different communications requirements.

In addition, not only does each network protocol require different input and output communication devices for communication with the various above protocols, but there is also the need of having input and output communication devices for communication directly with the PLCs. Communication between the PLCs and the input and output communication devices can have yet another type of communication protocol which may require different types of input and output communication devices for each different type or brand of PLC.

The present invention is provided to solve these and other problems.

SUMMARY OF THE INVENTION

The present invention is an input/output body for interfacing between field devices and a field master. Field devices can include devices such as digital or binary inputs, digital or binary outputs, analog inputs, analog outputs, QPR units or other special units, and INTIO devices to name only a few. Field masters can include programmable logic controllers (PLCs) (sometimes referred to as process control devices or PCDs), application specific controllers, and host computers/devices such as a personal computer with industrial automation software running thereon. For example, U.S. Pat. No. 5,611,059 discloses various types of controllers within a control structure for interfacing with the field devices, as well as user interface of a personal computer having industrial automation software running thereon.

The input/output body has a plurality of in-data registers for accepting data from the field devices (typically the state of the field device), a plurality of out-data registers for sending data to field devices (directing the field device to take a particular state), and an identification register for identifying the data in relation to the field devices. The input/output body also has an interface portion, or connection area, having an identification port communicating with the identification register, an in-data port communicating with the in-data registers, and an out-data port communicating with the out-data registers. The interface portion also has a clock port and a latch port for clocking and latching the data, respectively. The input/output body can directly attach to and communicate with a plurality of different types of communications adapters through the interface portion for communication with a field master. The input/output body can also directly attach to and communicate with a PLC type of field master through the interface portion.

Each communication adapter which is used with the input/output body is configured to directly attach to and communicate through the in-data port, the out-data port, and the identification port. In addition, each communications adapter is also configured to communicate with at least one of the various types of field masters, and the communications protocols for such field masters, such protocol types being generally mentioned above. The communications adapter has an input multiplexer for accepting data from the in-data port and from the identification port, an output multiplexer for providing data to the out-data port, and a processor for communicating with the input multiplexor and the output multiplexor. The processor is also provided for converting the data, received from the input multiplexor and the output multiplexor, to and from a format which is compatible with the communications protocol of a field bus upon which the field master resides. Field bus circuitry is also connected between the processor and the field bus, within the communications adapter, for allowing the processor to communicate with the field master on the field bus.

Alternatively, the communications adapter has at least one application specific integrated circuit (ASIC) for accepting data from the in-data port and from the identification port, and for providing data to the out-data port. The ASIC converts the data to and from a format which is compatible with the communications protocol of a PLC type of field master. The PLC type of field master is configured to communicate with the in-data port, the out-data port, and the identification port through the ASIC mentioned above.

The present invention cane take the form of only an input body or only an output body having the same advantages and the full input/output body, as will be decribed in greater detail below. In addition, the combination of the input/output body along with the communications adapter is described as an input/output system herein.

Other advantages and aspects of the present invention will become apparent upon reading the following description of the drawings and detailed description of the invention.

BRIEF DESCRIPTION OF THE DRAWINGS

FIG. 11 is a data passing chart for the present invention.

FIG. 12 is a data passing chart for the present invention.

FIG. 13 is a data passing chart for the present invention.

FIG. 14 is a data passing chart for the present invention.

FIG. 15 is a data passing chart for the first byte of the IO body identification of the present invention.

FIG. 16 is a data passing chart for the second byte of the IO body identification of the present invention.

FIG. 17 is a chart depicting an example of the identification procedure for the present invention.

FIG. 18 is a chart depicting an example of the identification procedure for the present invention.

FIG. 19 is a chart depicting an example of the identification procedure for the present invention.

FIG. 20 is a chart depicting the message passing word for the present invention.

FIG. 21 is a chart depicting the message passing word for the present invention.

FIG. 22 is a chart depicting the message passing word for the present invention.

FIG. 23 is a chart depicting an example trace of a transferred message for the present invention.

FIG. 26 is a state description chart for the present invention.

FIG. 28 is a connection description chart for the connection layout in FIG. 27.

FIG. 30 is a load capacitance chart for the interface portion of the present invention.

FIG. 31 is a signal level chart for the interface portion of the present invention.

FIG. 32 is a signal level chart for the interface portion of the present invention.

FIG. 33 is an equivalent circuit schematic diagram in relation to the interface portion of the present invention.

FIG. 35 is a reference chart for the timing chart of FIG. 34.

DETAILED DESCRIPTION

Figure 1:
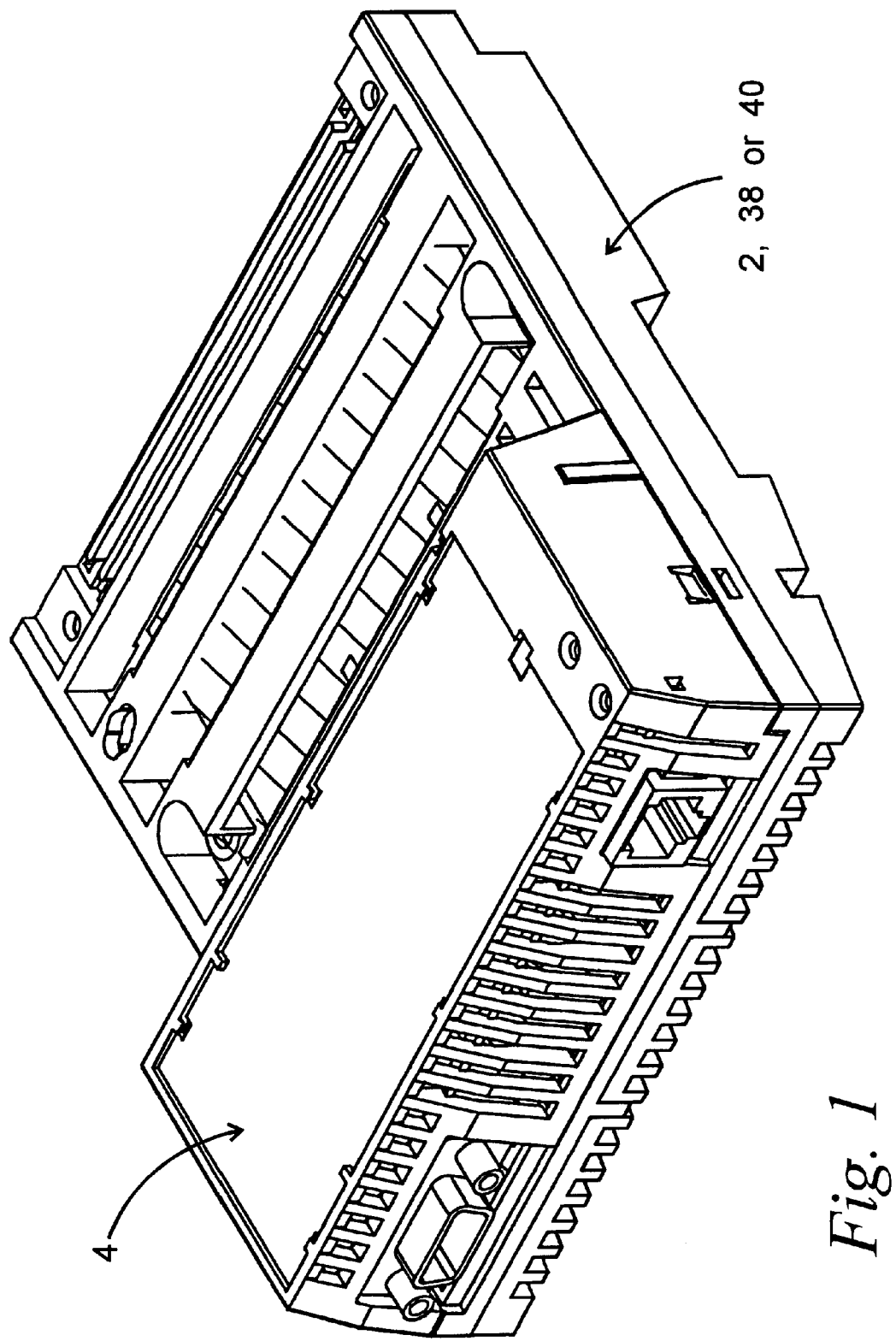
FIG. 1 is a perspective view of the input/output body, with one communications adapter attached thereto, of the present invention.
Figure 2:
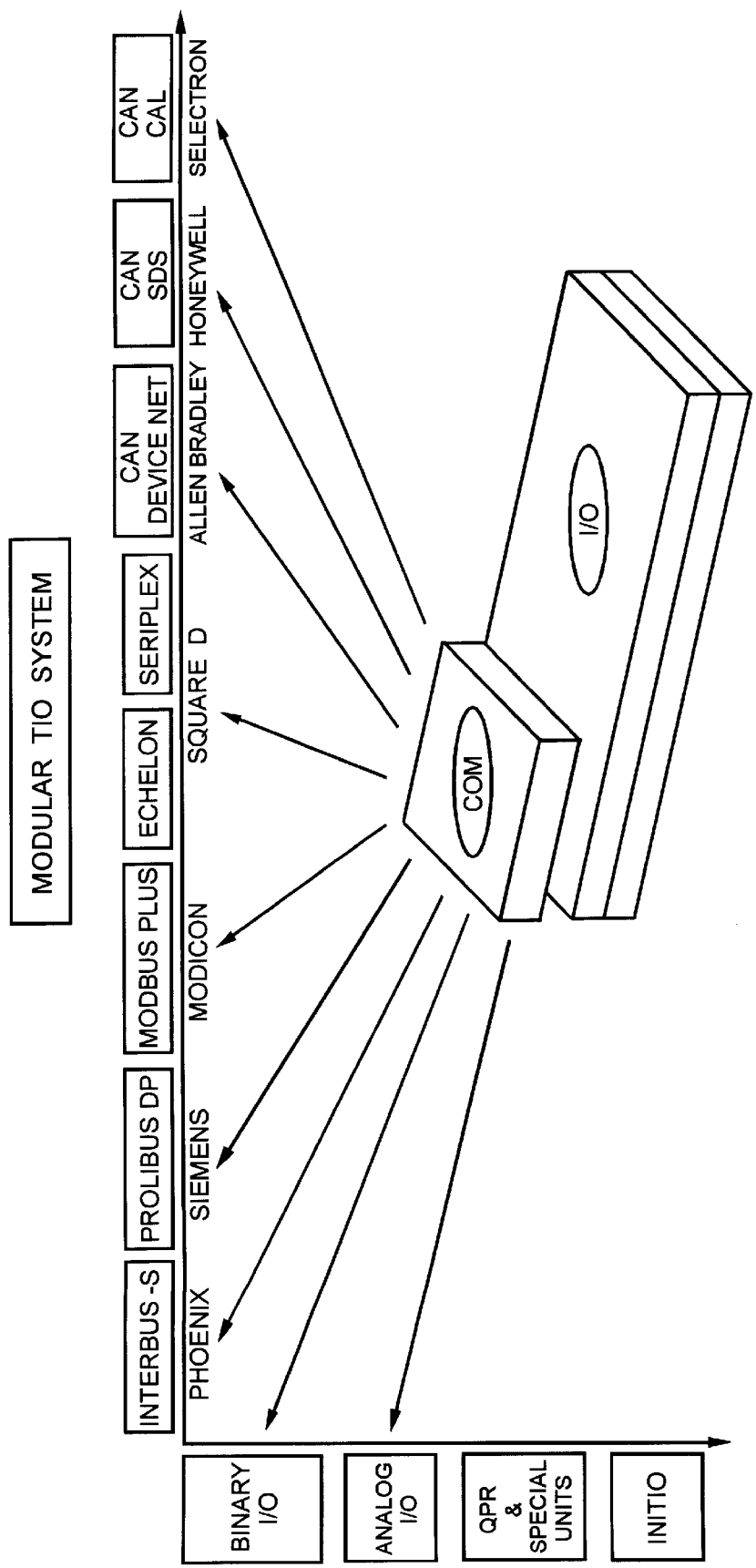
FIG. 2 is a modularity chart showing the flexibility of the present invention.

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiments illustrated.

With reference to FIG. 1, the present invention is an input/output (IO) body 2 which allows mixing and matching of communications adapters (COM-adapters) or PLC processors with the IO body 2. One COM-adapter 4 is shown in FIG. 1. The present invention, therefore, allows a customer to use a wide variety of communications protocols with the IO body 2. The present invention also reduces the number of products that are needed to create and support an industrial automation system. A protocol was developed in order achieve the present invention, and to allow a consistent interfacing between the IO body 2 and the communications adapter 4, as will be described in greater detail below.

Figure 3:
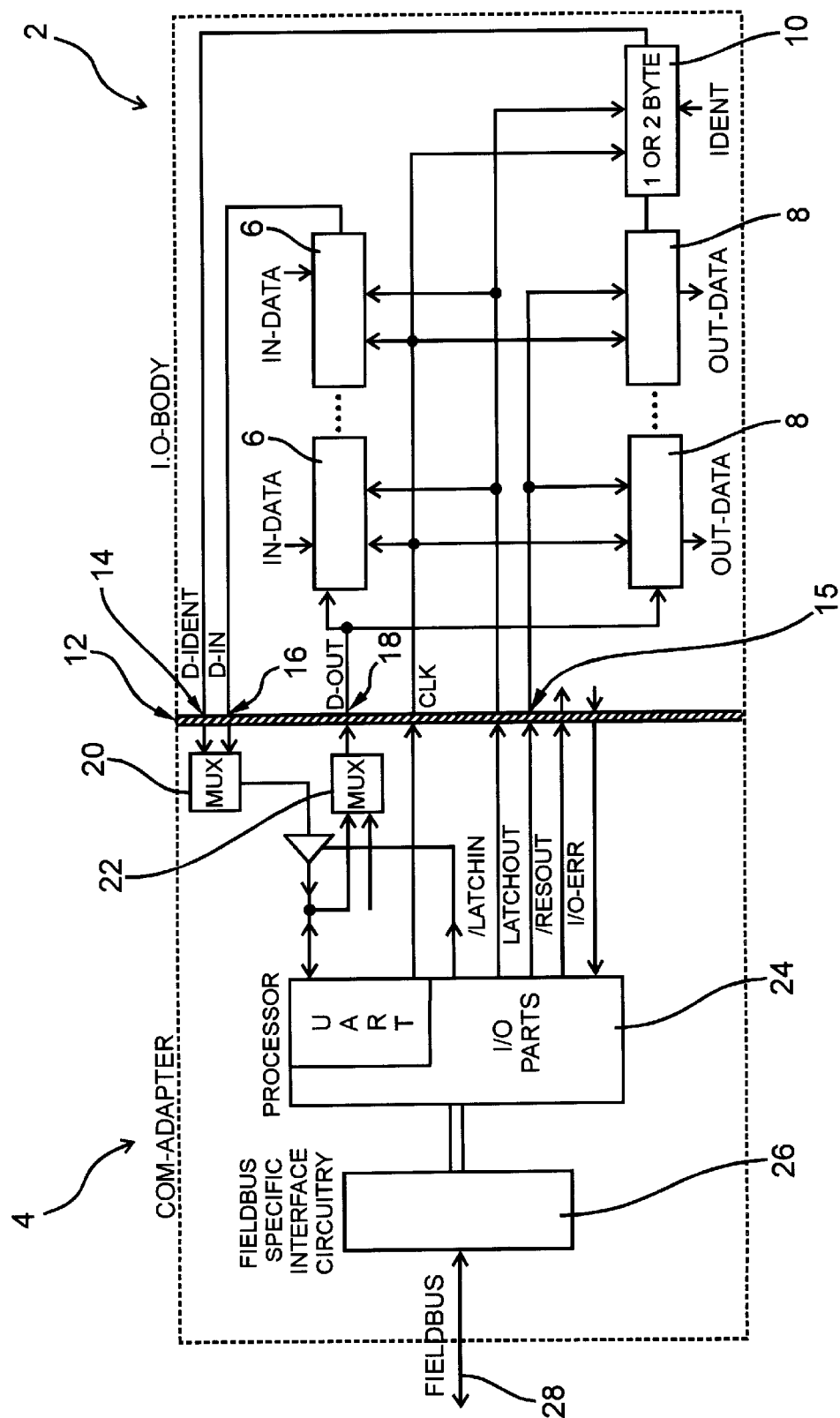
FIG. 3 is a functional block diagram of the input/output body, the interface portion, and one communications adapter of the present invention.

The IO body 2 interfaces between field devices (not shown in FIG. 1) and a field master (not shown in FIG. 1). With reference to FIG. 3, the IO body 2 has a plurality of in-data registers 6 for accepting data (shown as IN-Data) from the field devices. The IO body also has a plurality of out-data registers 8 for sending data (shown as OUT-Data) to the field devices. The IO body further has an identification register 10 for identifying (shown as IDENT information) the data in relation to the field devices. The identification register 10 in FIG. 3 is shown as being either one or two bytes. The IO body also has an interface portion 12. The interface portion has an identification portion 14 (shown as D-IDENT) communicating with the identification register 10, an in-data port 16 (shown as D-IN) communicating with the in-data registers 6, and an out-data port 18 (shown as D-OUT) communicating with the out-data register 8. The IO body can directly attach to and communicate with a plurality of different types of communications adapters 4 through the interface portion 12 for communication with a field master. The IO body can also directly attach to and communicate with a PLC type of field master through the interface portion 12.

Each communication adapter 4 is configured to directly attach to and communicate through the in-data port 16, the out-data port 18, and the identification port 14. Each communication adapter 4 is also configured to communicate with one specific protocol for the various types of field masters, as will be described in greater detail below.

One communication adapter 4 shown in FIG. 3 has an input multiplexer 20 (MUX) for accepting data from the in-data port 16 and from the identification port 14. The communication adapter also has an output multiplexer 22 (MUX) for providing data to the out-data port 18. The communication adapter 4 further has a processor 24 for communicating with the input multiplexor 20 and the output multiplexor 22, and for converting the data, received from the input multiplexor 20 and the output multiplexor 22, to and from a format which is compatible with the communications protocol of a field bus upon which the field master resides. Specifically, the communications adapter 4 further has field bus circuitry 26 connected between the processor 24 and the field bus 28 for allowing the processor 24 to communicate with the field master on the field bus 28.

Figure 6:
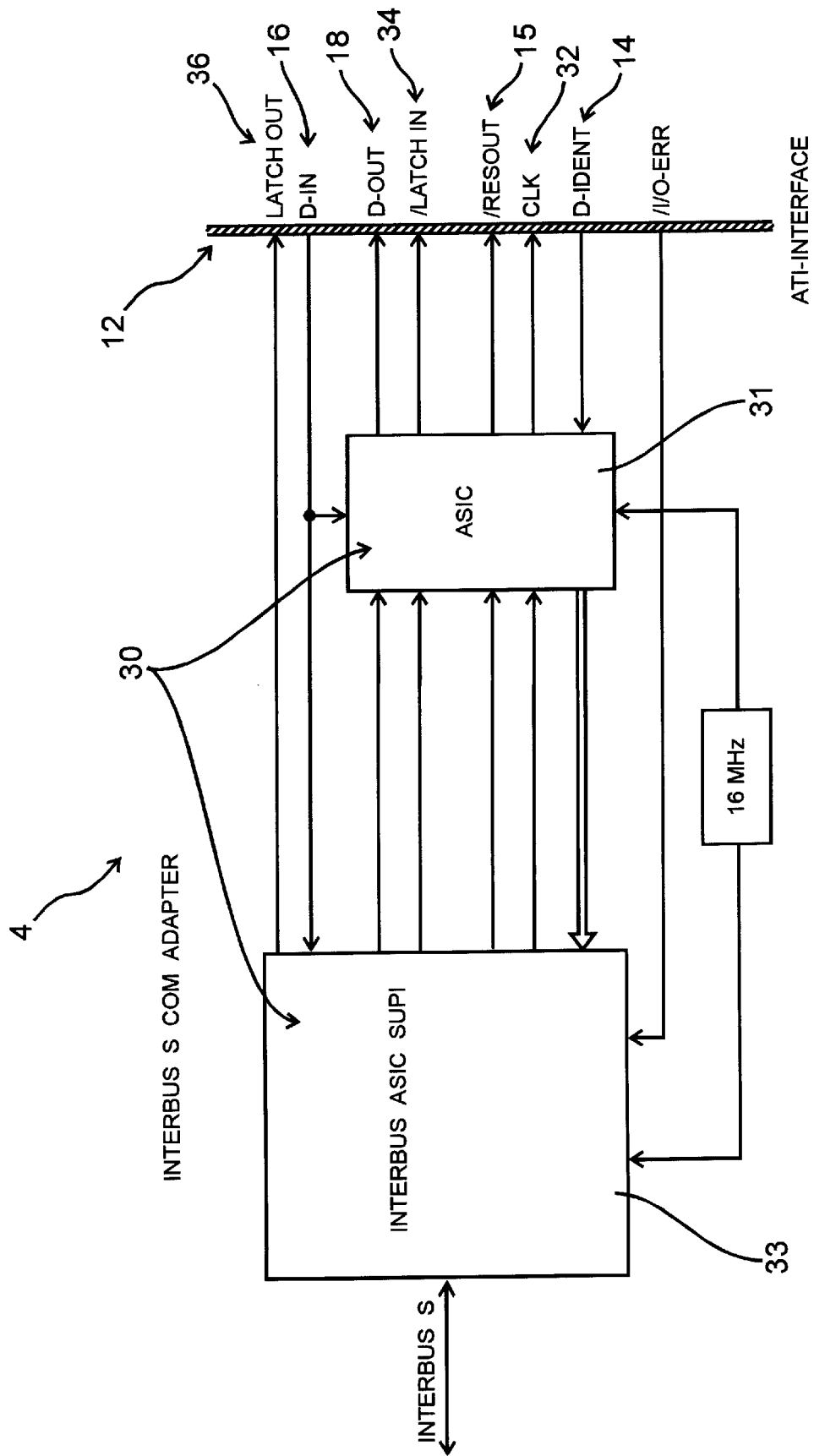
FIG. 6 is a functional block diagram of one specific communications adapter, and the interface portion of the present invention.

Referring to FIG. 6, a different communications adapter 4 is shown, and has an integrated circuit (IC) 30 for accepting data from the in-data port 16 and from the identification port 14, and for providing data to the out-data port 18. The IC 30 converts the data to and from a format which is compatible with the communications protocol of a PLC type of field master, such as Interbus S, as shown in FIG. 6. It should be understood that the IC 30 in FIG. 6 can be an application specific integrated circuit (ASIC) or a microprocessor (processor) with software (or firmware), and can also be one or more integrated circuits combined, as is shown in the embodiment in FIG. 6. Specifically, FIG. 6 shows an Interbus S COM adapter that is realized with two ASICs. The first ASIC 33 is a SUPI (a well known and standard part from OKI, Motorola, Atmel, and others) and controls the Interbus S protocol and the exchange of data between the IO body and the field bus master (field master). The second ASIC 31 was created by the applicant, (entitled an ISCA) and is used to run the identification of the IO-body and to translate the result into the Interbus-S format. The control of the IO body is then given to the SUPI and the ISCA is transparent. The field master can therefore, communicate with the in-data port 16, the out-data port 18, and the identification port 14. The interface portion 12 also has a clock port 32 and a latch port 34, 36 for clocking and latching the data, respectively. The latch port is made up of two ports in at least FIGS. 3 and 6 and includes a LatchIN port 34 and a LatchOUT port 36. The interface portion 12 further has a clearout port 15 (shown as /RESOUT or /ResOUT) for clearing the data in the out-data register 8.

Figure 5:
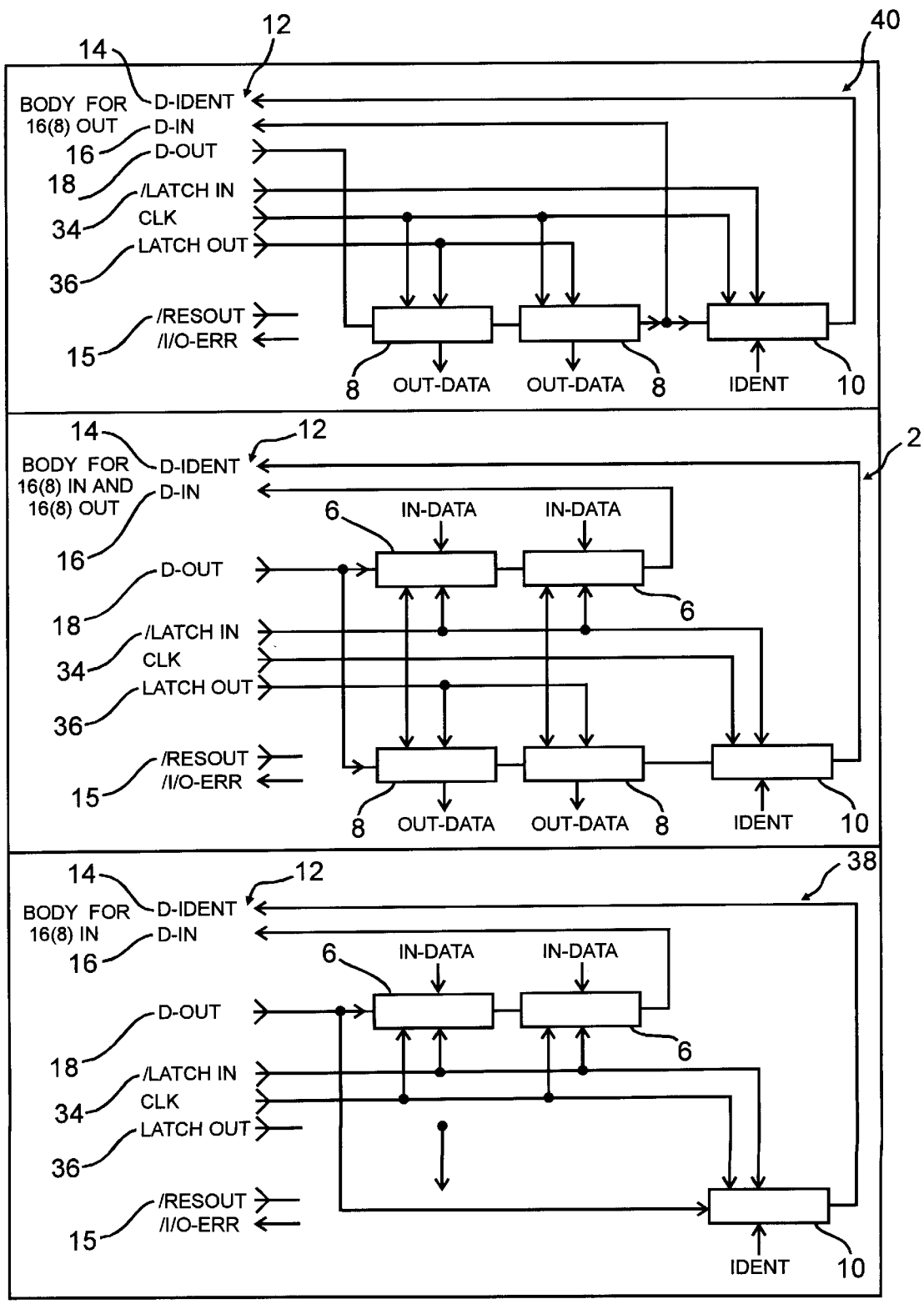
FIG. 5 is a functional block diagram of an output body, and input/output body, and an input body of the present invention.

Referring to FIG. 5, it should be understood that the term IO body takes the form of an input/output body 2. However, other devices are provided such as input body 38, and output body 40. The respective in-data registers and out-data registers are therefore only needed as shown within FIG. 5 for the respective input/output body, input body 38, and output body 40. Although FIG. 1 shows input/output body 2, this input/output body 2 can be replaced with input body 38 or output body 40. In addition, within the present specification, when the term IO body (or the like) is stated, input body 38 or output body 40 can conceptually be used in place thereof. The term transfer body 2, 38, or 40 is meant to encompass all of these (IO body 2, input body 38, or output body 40).

In view of this definition, the present invention can be stated as a transfer body 2, 38, or 40 for interfacing between field devices and a field master. The transfer body 2, 38, or 40 has a plurality of transfer registers 6 and/or 8 for communicating data relating to the field devices. The transfer body 2,28,40 also has an identification register 10 for identifying the data relating to the field devices, and an interface portion 12. The interface portion has an identification portion 14 communicating with the identification register 10, a transfer port 16 and/or 18 communicating with transfer registers 6 and/or 8. The transfer body 2, 38, or 40 can directly attach to and communicate with a plurality of different types of communications adapters 4 through the interface portion 12 for communication with a field master. The transfer body 2, 38, or 40 can also directly attach to and communicate with a PLC type of field master through the interface portion 12.

The communications adapter 4 is configured to directly attach to and communicate through the transfer port 16 and/or18 and the identification port 14. Each communications adapter 4 is also configured to communicate with one or more types of field masters.

With the present embodiment, the communications adapter 4 has a transfer multiplexer 20 and/or 22 for communicating data with the transfer port 16 and/or 18 and with the identification port 14. The COM-adapter 4 also has a processor 24 for communicating with the transfer multiplexor 20 and/or 22, and for converting the data, communicated with transfer multiplexor 20 and/or 22, to and from a format which is compatible with the communications protocol of a field bus upon which the field master resides. The COM-adapter also has field bus specific interface circuitry 26 connected between the processor 24 and the field bus 28 for allowing the processor 24 to communicate with the field master on the field bus 28. The circuitry 26 can take many different forms, such as a software (firmware) running on a processor or controller.

As will be explained in greater detail below, alternatively, the communications adapter 4 has one or more ASICs 30 for communicating data with the transfer port 16 and/or 18 and with the identification port 14. The ASIC 30 is also provided for converting the data to and from a format which is compatible with the communications protocol of a PLC type of field master. The PLC type of field master is configured to communicate with the transfer port 16 and/or 18 and the identification port 14.

The combination of the IO body 2 and the COM-adapter 4 can also be considered as an input/output (IO) system for interfacing between field devices and a field master. The system would therefore, include the IO body 2 having a plurality of in-data registers 6 for accepting data from the field devices, a plurality of out-data registers 8 for sending data to the field devices, and an identification register 10 for identifying the data in relation to the field devices. The system would also include the interface portion 12 having an identification portion 14 communicating with the identification register 10, an in-data port 16 communicating with the in-data registers 6, and an out-data port 18 communicating with the out-data register 8. The IO body 2 can directly attach to and communicate with a PLC type of field master through the interface portion 12. The system further includes a communications adapter 4 removably attached to the IO body through the in-data port 16, the out-data port 18, and the identification port 14. As mentioned above, the communications adapter 4 is configured to communicate with a specific type of field master, based on the various different types of communications protocols for the field masters.

Considering that the IO body 2 can also be an input body 38 or output body 40, the present invention can also be described as an data transfer/interface system 2, 38, or 40, and 4 for interfacing between field devices and a field master. The system has a transfer body 2, 38, or 40 having a plurality of transfer registers 6 and/or 8 for communicating data relating to field devices, and an identification register 10 for identifying the data relating to the field devices. The system also has an interface portion 12 having an identification portion 14 communicating with the identification register 10, a transfer port 16 and/or 18 communicating with the transfer registers 6 and/or 8. The transfer body 2, 28, or 40 can directly attach to and communicate with a PLC type of field master through the interface portion 12. The system also has a communications adapter 4 removably attached to the transfer body 2, 38, or 40 through the transfer port 16 and/or 18 and the identification port 14. The communications adapter 4 is configured to communicate with a specific type of field master. In the present embodiment, the communications adapter 4 has a transfer multiplexer 20 and/or 22 for communicating data with the transfer port 16 and/or 18 and with the identification port 14. The COM-adapter 4 also has a processor 24 for communicating with the transfer multiplexor 20 and/or 22, and for converting the data, communicated with transfer multiplexor 20 and/or 22, to and from a format which is compatible with the communications protocol of a field bus upon which the field master resides. The COM-adapter 4 also has field bus circuitry 26, which can take the form of processor with software, connected between the processor 24 and the field bus 28 for allowing the processor 24 to communicate with the field master on the field bus 28. Alternative forms of the COM-adapter 4 come to mind with reference to the remainder of the present specification.

Referring only to the IO body 2 form of the present invention while keeping in mind that the IO body 2 can also be a input body 38 or output body 40, the present invention will, therefore, only use one IO body 2 with different communication adapters 4 (COM-adapter). The IO body 2 can operate on different field busses by just replacing the communication adapter 4. In one embodiment of the present invention, the interface between the IO body 2 and COM-adapter 4 (or PLC processor (CPU)) is optimized for the Interbus-S protocol, as shown in FIG. 6. The IO body works with serial and synchronous shift registers. The COM-adapters 4 will work as a bridge between the IO-body 2 and the field-bus 28. This will normally require software running on a microprocessor. In one embodiment shown in FIG. 6, because the IO body is optimized for the Interbus-S protocol, the COM-adapter 4 only requires an small ASIC (application specific integrated circuit) for the identification of the IO-body, although this embodiment can use software running on microprocessor.

More detail will now be provided about the internal operations within the present invention. The Interbus-S procedures for identification within the IO-body and for message passing (e.g for parameters) are defined below. Referring to FIG. 3, there will exist a wide range of different IO-bodies with a various amount of data, even some with status and parameters. Normally the status and parameters will be placed in one frame running cyclically between the COM-adapter 4 and the IO-body 2. Therefore, it is possible to build a cost-optimized Interbus-S COM-adapter 4. COM-adapters 4 for other field-busses have to work as a bridge and fit the data and status/parameters transmitted via the field-bus with different telegrams into one frame to be exchanged cyclically with the IO-body.

As the system will be used in general as distributed IO, a customer will not accept to switch logic supply off and on again in the case of any failure. Therefore, it is preferable to control any state-machine or software running on a microprocessor with its own watchdog. If the watchdog expired, the adaptable IO body would have to bring the outputs to the secure state, but should be able to communicate with the field-bus master to get aware how to go on.

Figure 4:
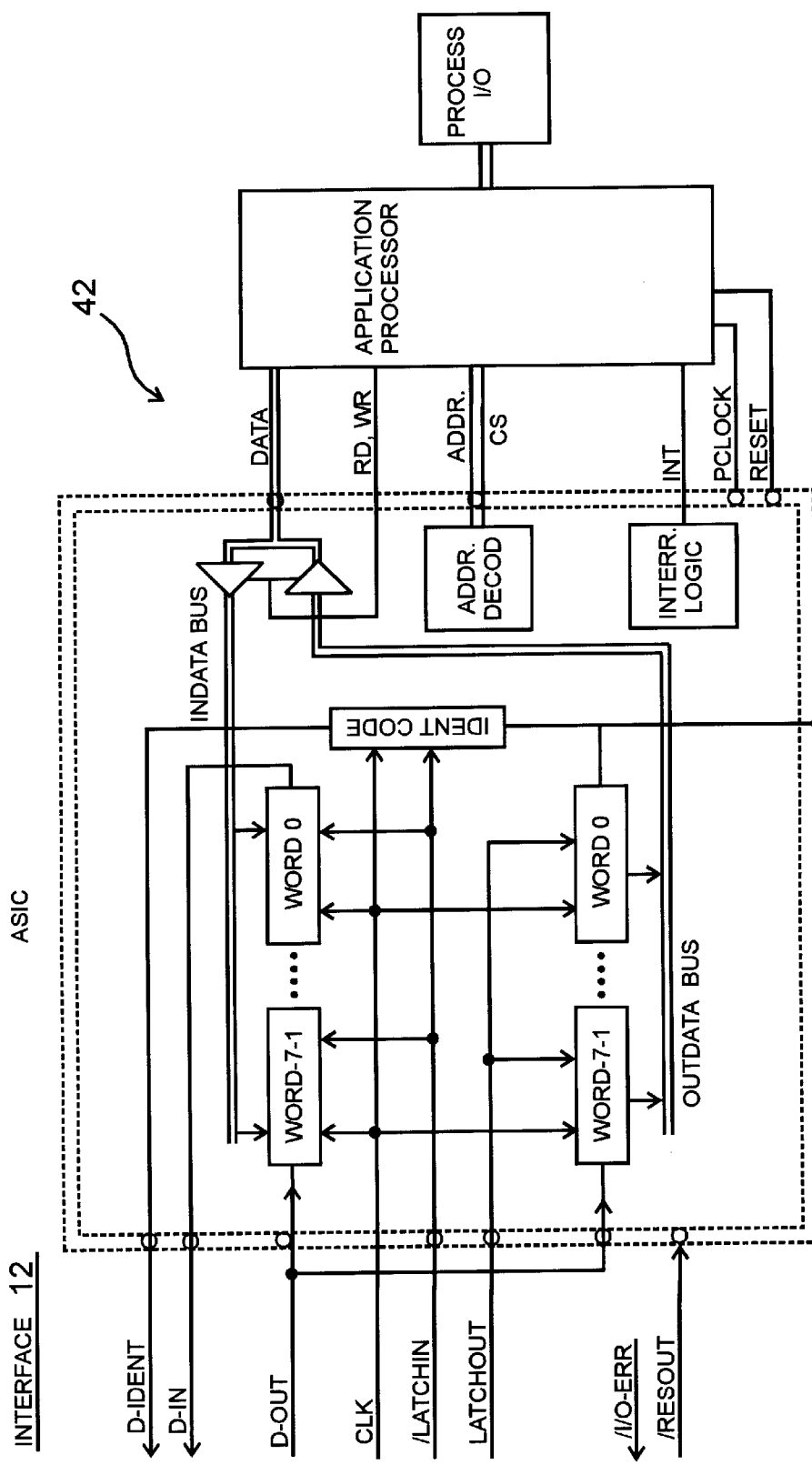
FIG. 4 is a functional block diagram of the interface portion, an ASIC, and application processor attached thereto, of the present invention.

With reference to FIGS. 4 and 5, for the IO-bodies 2 of the present invention, low cost shift registers can be used (such as 74HC165, 74HC597 or 74HC595). More complex IO bodies, like 8/16 channel analog modules, will use an ASIC which includes a sufficient amount of shift registers. The structure is the same as for simple IO-bodies, only the amount of shift registers is higher (maximum eight words in and out). The shift register ASIC connects directly to the signals of the interface portion 12, like normal shift registers. On a secondary side 42 a microprocessor interface is generated.

As the Interbus-S COM-adapter 4 will handle the IO-body 2 as an external register extension of the S$\mu$PI, there are some restrictions under the Interbus-S protocol which need to be followed. First, for IO-bodies 2 with input and output data, the serial data path has to be wired "through" the input shift registers, and the amount of input shift registers has to be not less than the amount of output shift registers. Second, the shift registers in the IO-body should be word oriented (because Interbus-S is word oriented and not able to drive 8 bit modules). An 8 bit module (e.g. 8 bit IN/8 bit OUT) must complete the 8 bit to a 16 bit structure. Third, the length, or the number of words, which is the greater of the IN-words and OUT-words, that adaptable IO system can use must be one out of the following: 1, 2, 3, 4, 5, 6, 7, 8, 9, 10, 12, 14, 16, 24, or 32 words.

With reference to FIG. 6, the Interbus-S COM-adapter 4 does not have to have a processor with software. A simple ASIC can be used for acquiring the IO identcode (IDENT) and to configure the S$\mu$PI. After identification and configuration is done, the ASIC becomes transparent and the signals from the S$\mu$PI are connected to the interface portion 12. This COM-adapter 4 allows the maximum amount of data on Interbus-S since the shift registers reside on the IO body 2.

Figure 7:
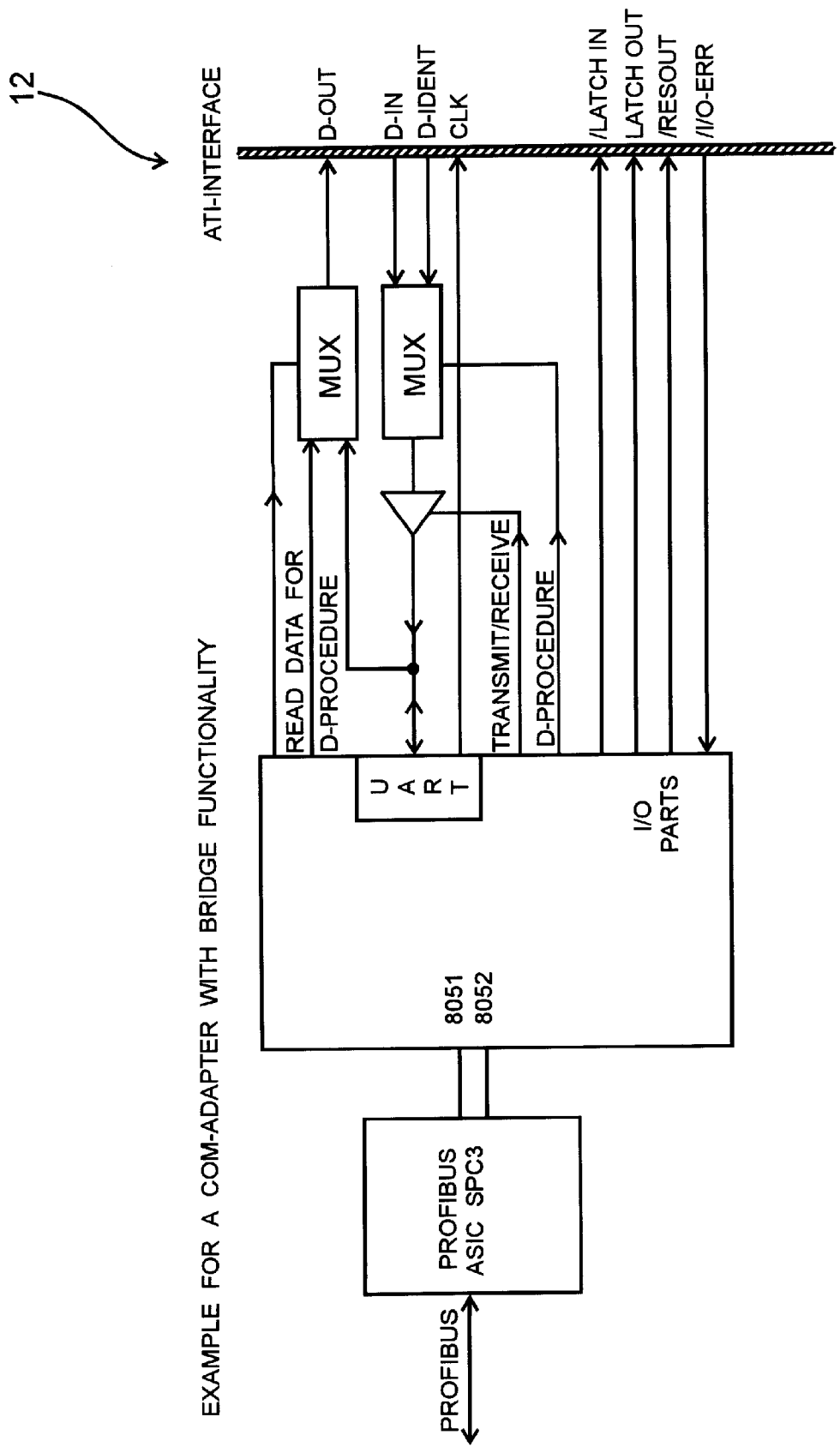
FIG. 7 is a functional block diagram of another specific communications adapter, and the interface portion of the present invention.

With reference to FIG. 7, as an example, all other COM-adapters 4 will use a processor to provide the functionality of a bridge between the field-bus and the Interbus-S like IO body 2. The processor could be the 8051, where the UART uses the shift register mode (Mode 0). In this mode, the transmission speed is fixed to 1/12 of the processor clock (1 Mbaud at 12 MHz). The Modbus Plus COM-adapter 4 looks similar to the Profibus-DP COM-adapter 4, but the controller is an 80C152.

Figure 8:
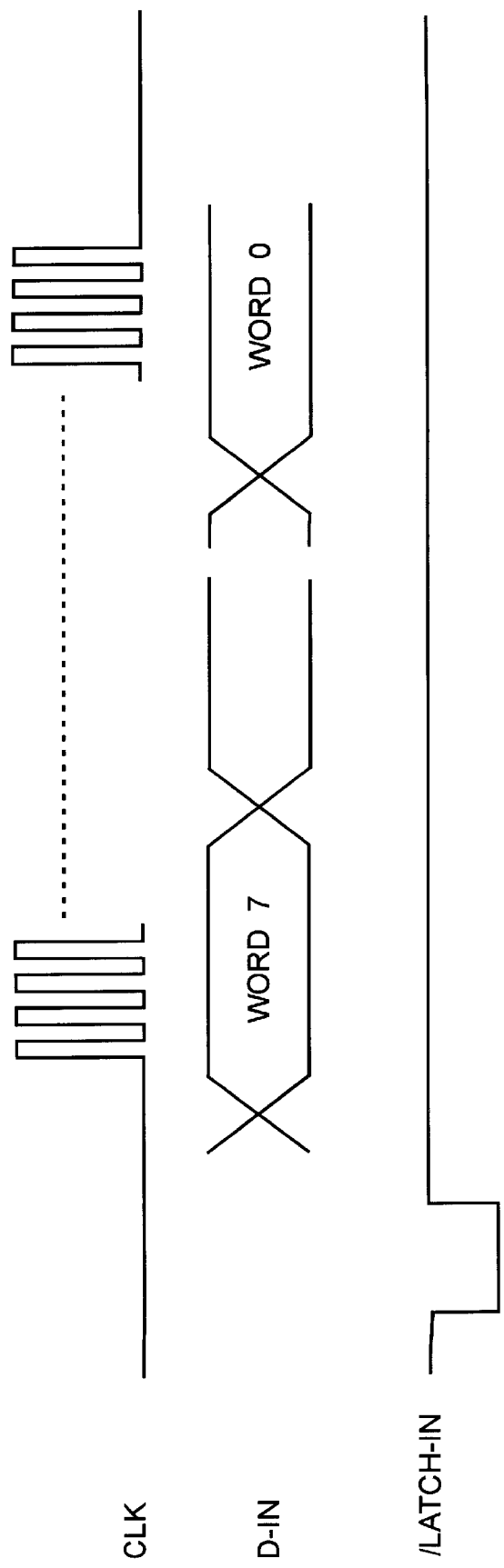
FIG. 8 is a communications timing diagram for the present invention.
Figure 9:
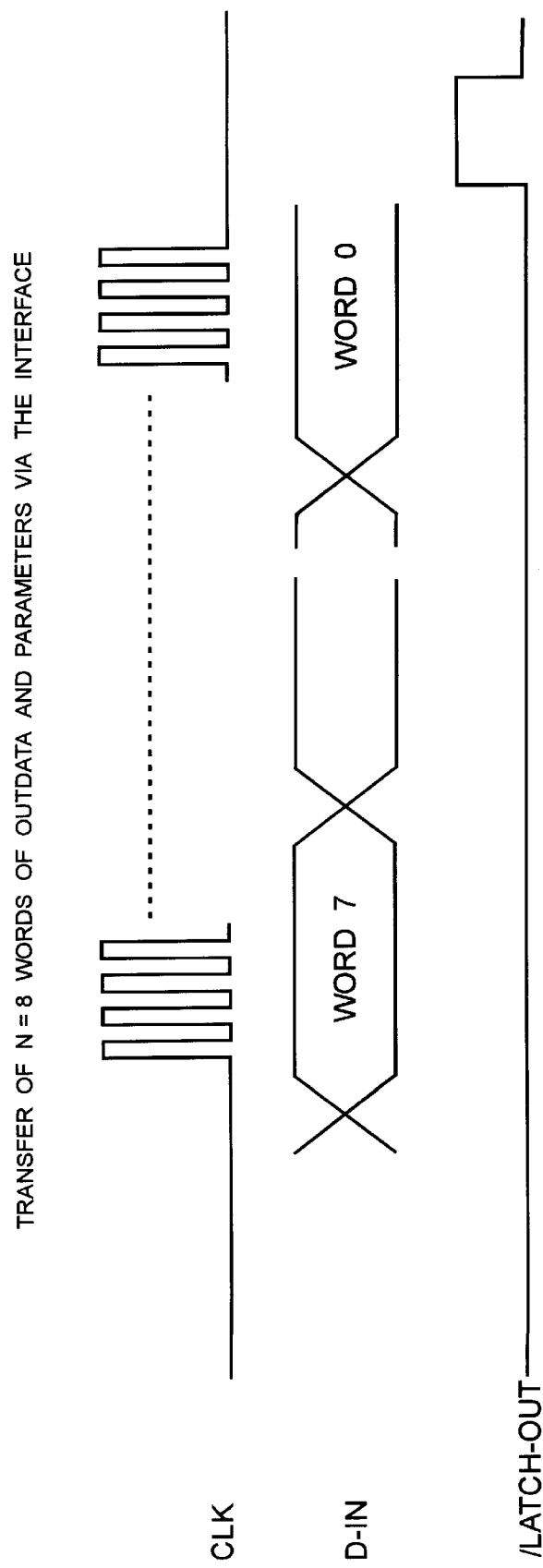
FIG. 9 is a communications timing diagram for the present invention.
Figure 10:
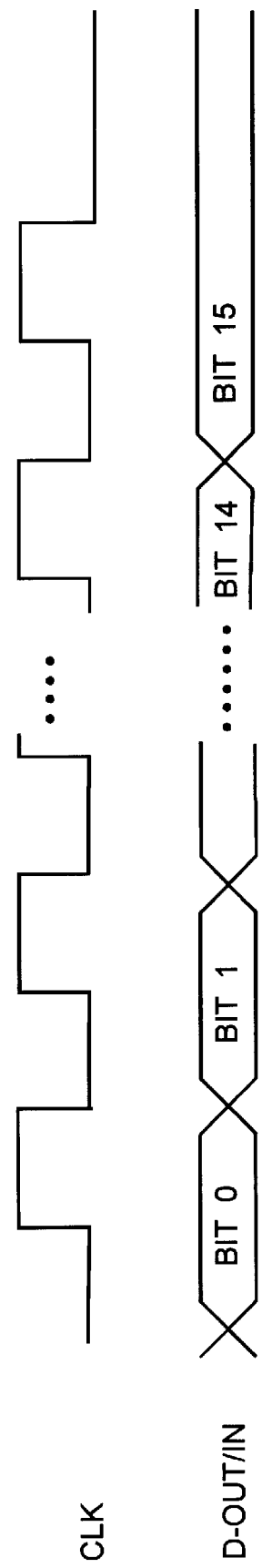
FIG. 10 is a communications timing diagram for the present invention.

With reference to FIG. 8, the system works as follows. After POWER ON, the COM-adapter 4 first identifies the IO-body it is connected to. Then the COM-adapter 4 configures itself for field-bus communication. Data transfers can then take place via the field-bus. The COM-adapter 4 must fit the data and parameter/status transmitted via the field-bus, with different frames into one frame exchanged cyclically with the IO-body 2. This frame can also include words of status and parameter. IN-data from the IO-body 2 must be latched first into the shift registers, then the IN-data will be shifted into the COM-adapter 4 starting with the first word. OUT-data must be shifted first into the shift registers of the IO-body 2 starting with the first word. After the last word has been transferred, all words have to be latched from the shift registers into the latch registers.

No special procedure needs to run between the COM-adapter 4 and the IO-body 2, with only one exception: the identification procedure, necessary for the COM-adapter 4 to be able to identify itself on the field-bus. If there is any special feature or behavior of an IO-body, this has to be handled only by the field master, e.g. the PLC. This is to avoid the necessity of upgrading COM-adapters, if new IO-bodies with features requiring a special procedure will be added to the scope of products. As there will be separate shift registers for IN-data and OUT-data on each IO-body 2, it is possible to transfer data in full duplex. The maximum amount of shift registers is 32 words IN-data and 32 words OUT-data.

Referring to FIG. 11, this Figure shows how the words of information will be placed into a frame for input and output data, status and parameter, and for the message passing procedure. There exists a defined organization for each kind of word, where it has to be placed in the frame. The possible length of the frame is shown within FIG. 11.

If there are several words or parameter/status or words of process output/input, the order of the single words of parameter/status has to be the same as the order of the single words of process output/input. If parameters for several values (channels) are put together into one parameter-word, the order of these parameters must be the same as the serial order of the according values (channels) transferred via the interface portion 12. FIG. 12 shows an example of an analog IO body with four channels out. FIG. 13 shows examples for the relationship between a word in the cyclic frame and a peripheral IO point. FIG. 14 shows an analog IO body with two channels out and two words of parameter information with four channels in and two words of status.

Identification Procedure

With reference to FIGS. 15 and 16, the IO-body 2 identification includes information about the code for each IO-body (e.g. 16 OUT 24VDC 0.5A), the group the IO-body belongs to, and the number of status words and parameter words included in the cyclic frame between COM-adapter 4 and IO-body 2. This can be accomplished with one or two 8 bit shift registers. The first one for the code and group information, the second one for number of status and parameter bytes and an algorithm, which may be used for handshake during transfer of parameters. This algorithm must be executed by the COM-adapter 4. The first byte is structured to divide all IO-bodies into 5 groups, which allows an easy integration of new modules and an easy generation of the Interbus-S ID code. The second byte contains information about the number of status and/or parameters included in the cyclic frame. The second byte has to be present if the IO-body has status or parameter information. For IO-bodies without status/parameter, the shift register need not be used. Therefore, there will be no cost increase for all simple IO-bodies, which do not provide status or parameters. The length of input and output can easily be determined by shifting a predefined value through the data paths (see the block diagrams of the different IO-bodies in FIGS. 4 and 5).

To allow a clear differentiation later in this specification, two new terms are introduced here: First, IO-bodies, which do not have the second ID-byte are called "simple modules", and second, IO-bodies, which have the second ID-byte are called "complex modules." This differentiation is necessary for some COM-adapters 4 to analyze the IO_ERR signal.

Translation of the IO-body Identcode Into a Structured Field-bus Identification

The Interbus-S identcode is an example for a structured field-bus identcode. It includes information about the group the module belongs to and the length of data. This Interbus-S identcode can easily be generated on the COM-adapter by converting the IO identcode and length information.

Translation of the IO-body Identcode into a Non-structured Field-bus Identification The Profibus identification is based on a non-structured identnumber and data length information. The identnumber is the key for the extensive description of the module residing in a file on the busmaster (device data base). The identnumber has to be requested by the Profibus user organization.

The identification of the IO-body 2 is possible by executing the following steps. (When starting this procedure during normal data exchange, it should be understood that all output shift registers will be reset to zero)

1) Reset the output shift registers, e. g. /RESOUT 1->0->1
2) /LatchIN 1->0->1 to latch the body identification (ID).
3) Shifting out 0xFF into D-OUT will bring out the first byte of the body ID at D-IDENT. As long as this byte will be zero go back to step 1)

Determination of the Amount of OUT-words

4) Going on with shifting out 0xFF into D-OUT and checking the input at D-IDENT n-times while counting the bytes containing 0x00. This must be stopped, if 0xFF is detected. Then the number of output bytes can be calculated.

a) if the first byte after the ID (step 3) was 0x00 then this IO-body has n−1 output shift registers and no parameters included.

b) if the first byte after the ID (step 3) was not 0x00, then this IO-body has n−2 output shift registers and bit 3 to bit 0 define the amount of parameter-words included.

Determination of the Amount of IN-words

5) Hold the output shift registers permanent in reset state (/RESOUT 1->0).
6) Shifting 64 times 0x00 into D-OUT to clear all input shift registers.
7) Shifting out a value not zero, e.g. 0xFF, into D-OUT and checking the input at D-IN n times while counting the bytes with 0x00. This must be stopped, if "non-zero" (0xFF) is detected. Then the number of input shift registers of this IO-body is n−1. If at step 4, a second byte body ID has been detected, then bit 6 to 4 define the amount of status words included in the n−1 input bytes. If the "non-zero" (0xFF) has been shifted (maximum possible number+1) times without detecting the "non-zero" (0xFF) at D-IN, then the IO-body has 0 input bytes.
8) Bring the output shift registers in normal operating state again (/RESOUT 0->1) to finish the identification procedure.

FIGS. 17, 18, and 19 depict the some examples for the identification procedure.

Message Passing Procedure

With reference to the figures beginning at FIG. 20, the following explains the message passing procedure. One goal for the present invention is to minimize the additional cost for the devices on the Interbus-S. Therefore, the IO-body with its shift registers, is directly part of the Interbus-S loop. Each IO-body that can take part in message passing is identified by an identcode of group expert IO-body. Any IO-body of this group will have a minimum of one word of IN and one word of OUT used by this procedure. It depends on the special IO-body if there are additional words for process input or output and/or additional words for status or parameter. The basic procedure for transferring messages is as follows: There is one word reserved, which can be considered a "messaging window," where messages (if any) would be exchanged through over multiple cycles. This word is the word 0 of the cyclic frame.

The 16 bit fields of data in both directions per cycle that are reserved for messaging, have to be interpreted as 2 sub-fields, called 'control' and data.' The 'data' field is 8 bits long and carries one byte of data as part of a 'message.' The control field is used for message sequencing, and to indicate the beginning and end of messages in order to remove the need for other 'framing' mechanism. FIGS. 20, 21, and 22 show the outbound data, inbound data, and sequence number configurations for messaging, as well as the state transitions. For sequence numbering, since there is no need to have more than one unacknowledged message fragment outstanding at any time, the sequence number does not need to be more than one bit long. Two bits are allocated in order to allow representation of message framing and abort in addition to character sequencing. The minimum messages required (using Modbus framing) is as follows:

read NN words at index ABCD     request 03 AB CD 00 NN
response with BB bytes     response 03 BB 12 34..

| write NN words (BB bytes) at index ABCD | request 10 AB CD 00 NN BB 12 34.. |
| --- | --- |
| | response 10 AB CD 00 NN |

The following is an example of a simple read parameter exchange encoding:

| request: 03 00 00 00 01 | (read 1 word at index ABCD=0) |
| --- | --- |
| response: 03 02 12 34 | (reply BB=2 bytes of value 0x1234) |

FIG. 23 shows how the parameter exchange messages will be passed. Since the IO-body 2 and the COM-adapter 4 can operate with completely independent timing, such a mechanism can be made to work with or without support from the COM-adapter 4. If the COM-adapter 4 controls the state machine, then the messages can be exchanged at maximum speed, since there is no need to involve field-bus cycles to transport the 'raw' data to the master. If the field-bus (or COM-adapter 4) is not able to operate the state machine, then the data is exchanged transparently with the 'real' master (field master) who has to perform these operations in application logic or device driver code as applicable.

Performance Aspects

Most of the COM-adapters 4 will use a 80C51 type of microprocessor to operate the bridge functionality. This microprocessor will use mode 0 of its integrated UART to exchange data with the IO-body 2. As the transmission speed is fixed to 1/12 of the processor clock, the transmission rate for a clock of 16 MHz will be 0.8 microseconds/bit. To exchange one byte at mode 0, there is a minimum support required as reading receive register or writing the transmit register of the UART and reading from or writing to external memory. Therefore, it is assumed that the exchange of one byte including a minimum of support will take 10 microseconds/byte. The precondition for this assumption is that the exchange procedure will not be interrupted by any field-bus service. Some examples are as follows:

1) If the cyclic frame consists of 8 words of IN-data, one cyclic frame will take:

8*2 bytes*10 microseconds/byte=160 microseconds for this frame

Figure 24:
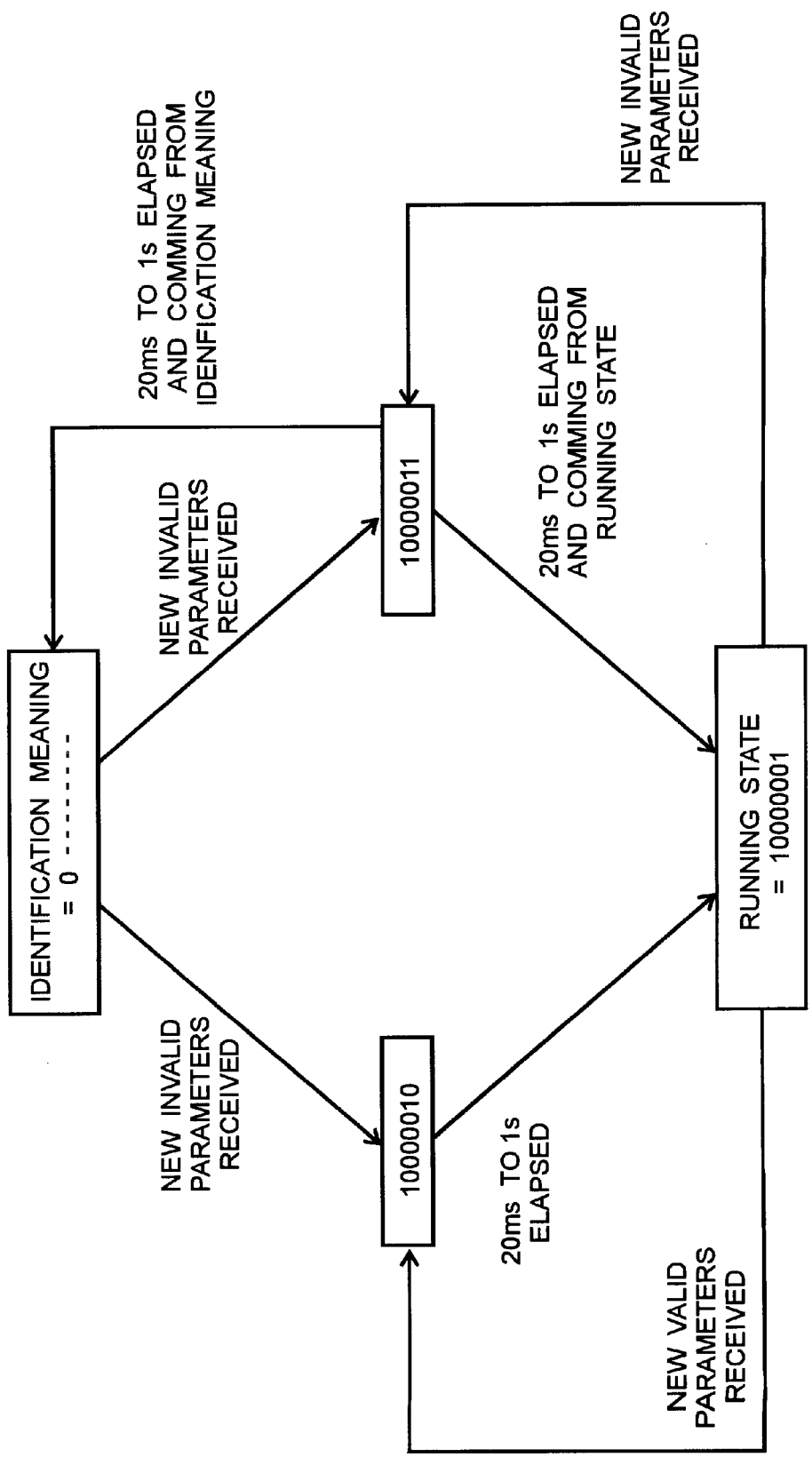
FIG. 24 is a flowchart for communication within the present invention.

2) If the cyclic frame consists of 32 words with message passing, there is only one byte of "real message passing data" included. As there are a minimum of two cycles necessary (transmit and acknowledge) in this example 64 word have to be transferred:

a) 2*32*'bytes=128 bytes (including I byte of data for message passing)

b) 128 bytes*10 microseconds/byte=1,28 ms for the exchange of the one byte of message passing data With reference to FIG. 24, the following describes the state diagram for all IO bodies 2 which need parameters. Because at least the FIPIO master must know if the parameters sent have been taken into account by the IO body 2 or not, the following protocol has been defined between the COM-adapter 4 and the IO body 2. The meaning of the second byte of the identification of the IO body will change after receiving the first parameter values. Bit 7 of this byte will be reversed to indicate the current meaning of the second byte:

If bit 7 is 0, bits 0 to 6 are the indentcode (number of parameter/status words)

If bit 7 is 1, bits 0 to 6 describe the current state of the IO body 2

The following defines the values for bits 0 to 6:

0000000: forbidden

0000001: the IO body is working

0000010: the IO body has received some new valid parameters

0000011: the IO body has received some new invalid parameters

1111111: forbidden

New parameters means parameters different from the current ones. This implies that a) any COM-adapter which wants to use the second identification byte meaning must check first that the parameters to be sent are different than the current ones, and b) every IO body which deals with parameters must check if it receives some parameters different from the current ones. FIG. 24 shows and describes the procedure for the second byte of identification. Within this Figure, the delay during which the IO body maintains the 10000010 or 10000011 value when taking into account some new parameters must last 20 ms. The whole response time after receiving some new parameters must not exceed 1 s.

Figure 25:
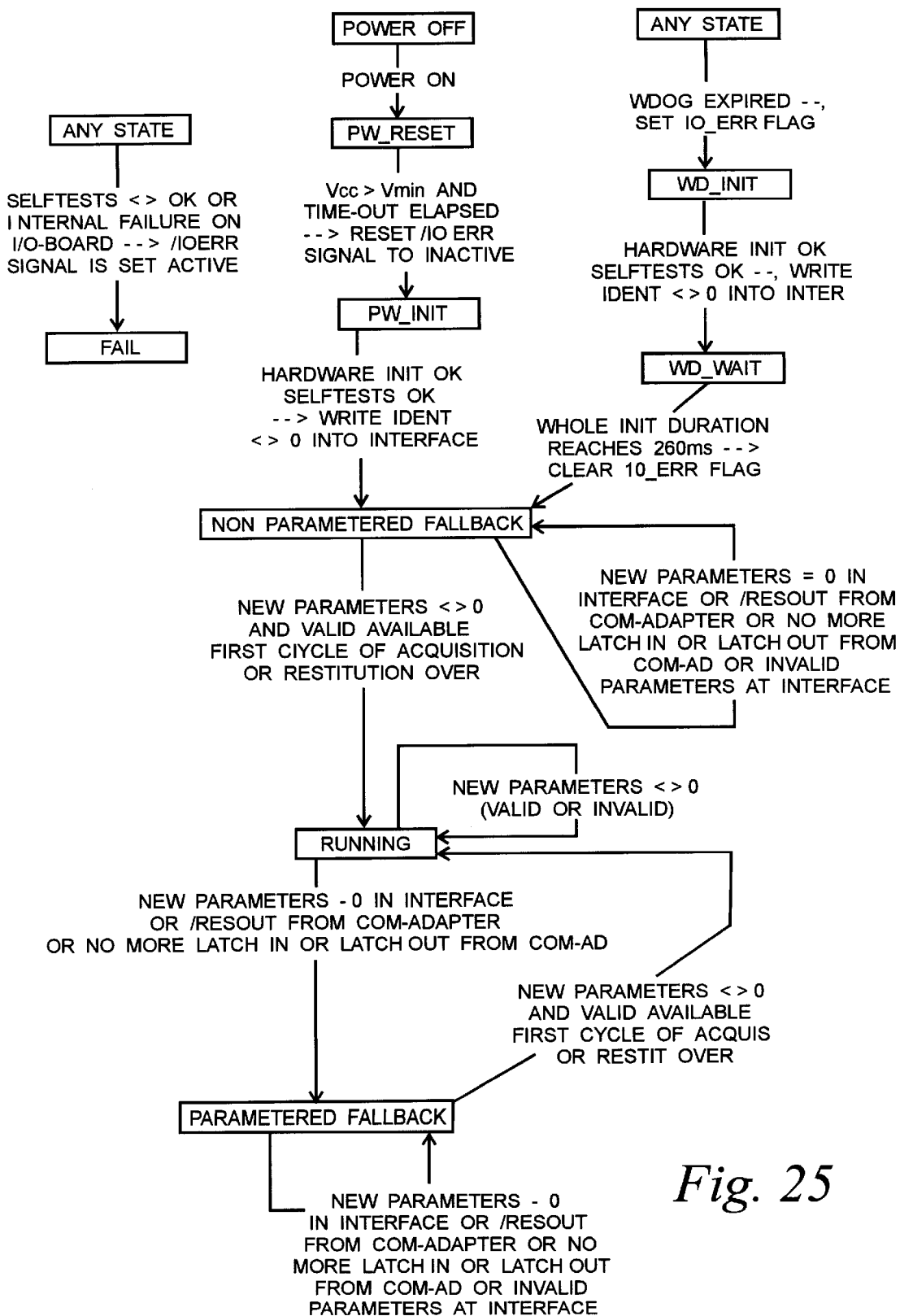
FIG. 25 is a input/output body state diagram for the present invention.

If some new parameters value come to the IO body faster than 20 ms each, some of the parameters may not be taken into account by the IO body. This particular meaning of the second byte of identification only applies to IO bodies dealing with parameters. Other IO bodies will not have to manage the second byte of identification (because they have no means to know that the identification procedure has been completed by the COM-Adapter). As a consequence of this specification, the number of status words is limited to 7 for the IO bodies for the specific embodiments of the invention present herein. The "new parameters" transitions within the states diagram in FIG. 25, and corresponding states description in FIG. 26, relate to the above identified rules.

FAIL State and the WDOG Behaviour

The only case of failure which has to lead to an automatic restate behavior is the watchdog expiration on the I/O body. In this case, the /IOERR signal has to be maintained active at least 270 ms (INTERBUS-S constraint) and maximum 1 second. After 1 second, the bus master can consider that this device has gone into the FAIL state and has to be changed by the user. All other failures (problems detected during self tests or other hardware problems) will lead to a FAIL state from which the IO body can go out only with [power off/power on] action. The IO body 2 will go into this state only when it needs to be replaced. It is important to run the self tests before writing the identification number into the interface; so, if a problem is detected when running the self tests, the identification code at the interface portion 12 will remain 0, and the COM-adapter 4 will be able to know that there is something wrong on the IO body 2, whatever the type of IO body 2 is present (simple or complex).

Monitoring of LATCH IN and LATCH OUT Signals

The monitoring of the latch-in and latch-out signals by the IO body 2 is not mandatory. If the IO body 2 does perform a monitoring, at least one word of status must be monitored. If the IO body 2 detects that it has not received a LATCH OUT or a LATCH IN signal for more than 1 second from the COM-Adapter 4, the IO body 2 must go into the fallback state. The lack of receipt of the latch signals will be indicated to the bus master by writing a special value into the status word (the /IOERR signal has not to be activated in this case because it is not an IO body 2 failure).

Reserved Codes for Parameter and Status

Zero is a reserved value for status and parameter, with the following meaning: If the parameter word(s) are zero, the IO body 2 has to remain in a fallback state and no automatic restart will be performed. If the status word(s) are zero, the local watchdog of the IO body 2 has expired.

Default Fallback Values

The default fallback value depends on the specification of the special IO body 2. The default fallback value for all IO bodies 2 should be zero.

Figures 27, 29:
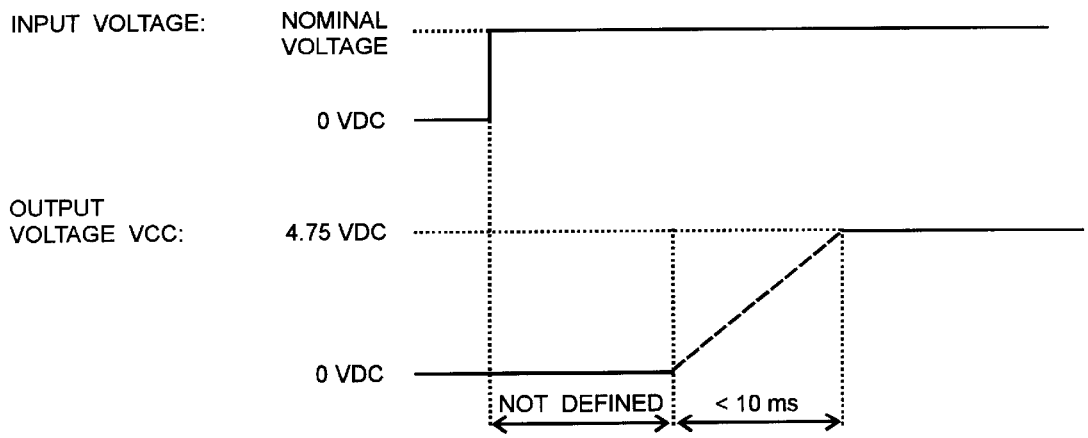
FIG. 27 is a connection layout for the interface portion of the present invention.
FIG. 29 is an input voltage graph and an output voltage graph for the present invention.

Referring to FIG. 27, a dual row connector layout is shown. This type of connection can be used within the present invention. The connector has 12 pins with a 2 mm raster.

Referring to FIG. 28, a chart is provided for describing the signals on the interface portion 12 (signals beginning with/ are low active).

The Use of /RESOUT

/ResOUT, when active, shall cause an output module to one of the following conditions: a) safe state—(if the output can not be configured), b) predefined value, or c) last value. An output module will go to a safe state if power is applied to the module without a top-hat connected it. (No connection of the ResOUT line from the top-hat has to cause /ResOUT active on the IO-body, see FIG. 33). The top-hat will activate the /ResOUT if forced to by the field bus, if commanded by software, or if abnormal operation is detected.

The Use of /IO-ERR

/IO-ERR is provided to indicate a failure on the IO body 2. In any case, if it should be guaranteed that the IO-Error will be recognized by the PLC, the signal has to stay active low for at least 270 ms (which is a restriction from Interbus S). On simple modules, /IO-ERR is used to notify external failures, such as overload condition on an output. The module has to remain in the "running" state. Simple module will never notify internal failures. The /IO-ERR signal should stay active as long as the IO Error is active. On complex modules, /IO-ERR is used to notify only internal failures, such as internal selftest errors or an expired local watchdog. In this case, these modules will behave as described as described above for simple modules. Complex modules will notify external failures only through data (input or status, depending on the IO body 2). There are two classes of internal failures:

1. failures detected by an internal self test; they will lead to a endless "/IO-ERR active."

2. watchdog expired or power-reset; which will lead to a temporary "/IO-Err active" of max. 1 sec. After /IO-Err becomes inactive, the IO body 2 should be reinitialized (identification procedure and transfer of parameters). It is expected, that a failure due to an EMC disturbance will lead to a restart forced by the expired watchdog. Any other internal failures, which require the change of the module or a "power-off power-on" sequence, should lead to the fail state, if detected by a selftest.

The power supply resides on the IO body 2 and generates the DC voltage "Vcc" from the input voltage, which can be either a DC or an AC voltage. With respect to potential isolation, no special rule exists for the interface portion 12 must be followed. Potential isolation depends only on the requirements for the IO body 2. The power supply does not generate a "power O.K." signal (RESET). The power O.K. signal has to be generated by the COM-adapter 4 or any other top-hat (top stacked device with the IO body) and the IO bodies themselves if necessary. It is preferable to use a voltage discriminator, such as a TL7705 to generate the "power O.K." signal (RESET). Short disturbances of the input voltage (missing half wave for AC and gap for DC) must be buffered by the power supply to make them invisible at Vcc.

The following lists the power for the top hats (typical COM adapter within a system):

Vcc=5.0V+/−5% (max. ripple 50 mVss included)

Icc max.=500 mA

Capacitive load=0 microF to 600 microF

Vcc rise/fall time>or=0.1 ms

Slew rate for power down depends on the load current; the power (Vcc) is stabilized on the IO body with a capacitance of 470 microF+/−20%. The slew rate for power up is shown within FIG. 29 (note that the input shape during power up can not be guaranteed).

FIGS. 30, 31, and 32 show and describe the signals on the interface portion 12. FIG. 33 shows and describes a preferred equivalent circuit diagram for the present invention. With reference to FIG. 33, a resistor of 100 Ohms must be placed in each signal on the COM-adapter 4 and on the IO body 2. Pulldown resistors on /RESOUT and I/O-ERR signals determine the signal level in case of no connection. The shift registers on the IO body 2 must to be placed near the interface connection 12 instead of distributing these registers over the circuit board. If more than five shift registers are used, an additional buffer for the CLK is required. This is to avoid slow transitions of the CLK-signal for the cascaded shift registers. The receivers must use an HCMOS or ACMOS input. In the case of ACMOS, inputs with Schmidt-Trigger must be used.

Figure 34:
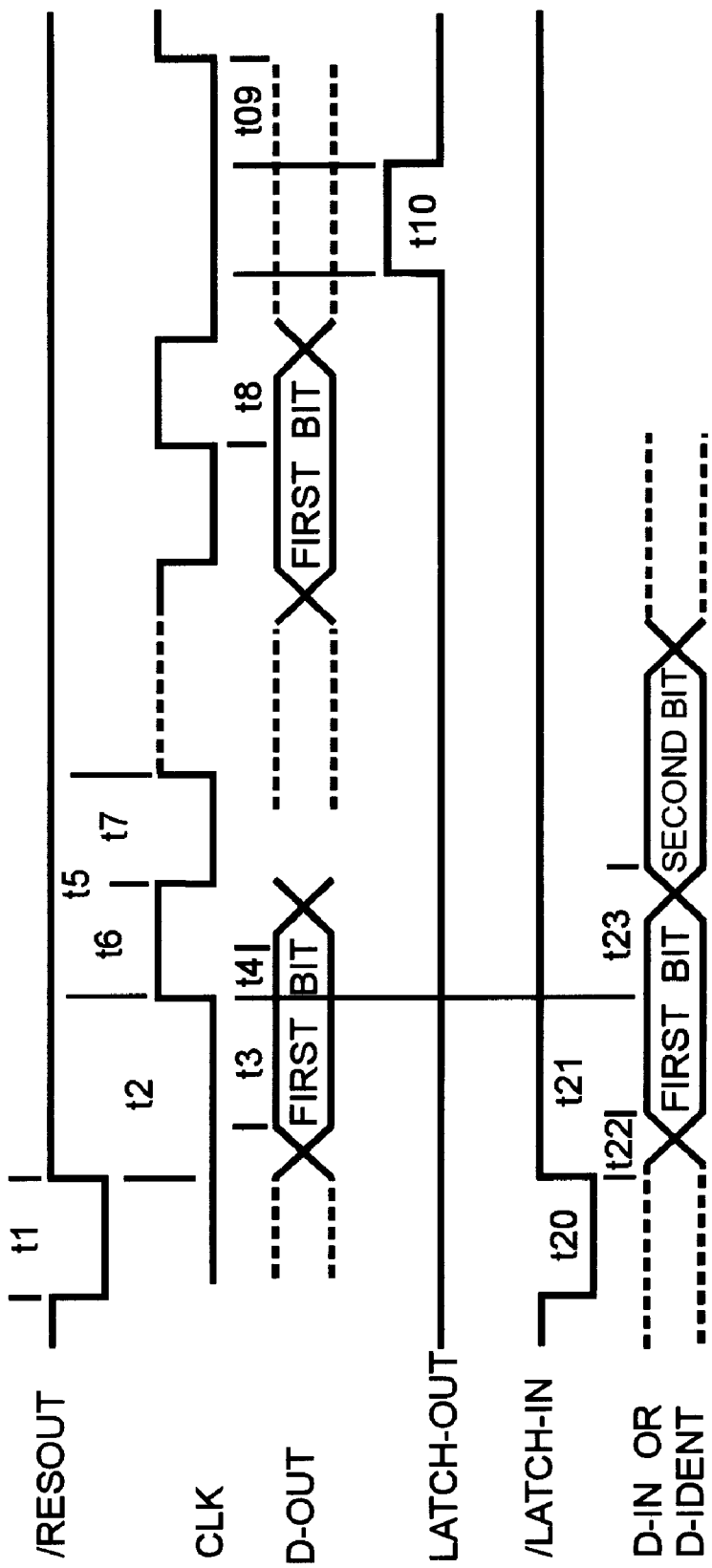
FIG. 34 is an timing chart for the interface portion of the present invention.

FIGS. 34 and 35 show the AC specification timing chart and reference chart therefore, for the interface signals. The transition time is the time the signal switches from Vol to Voh or vice versa.

While the specific embodiments have been illustrated and described, numerous modifications come to mind without significantly departing from the spirit of the invention and the scope of protection is only limited by the scope of the accompanying Claims.

We claim:

1. An input/output (IO) body for interfacing between field devices and a field master, the body comprising:

a plurality of in-data registers for accepting data from the field devices;

a plurality of out-data registers for sending data to field devices;

an identification register for identifying the data in relation to the field devices; and an interface portion having an identification port communicating with the identification register, an in-data port communicating with the in-data registers, and an out-data port communicating with the out-data registers, the body being adapted to directly attach to and communicate with a plurality of different types of communications adapters through the interface portion for communication with a field master, the body also being adapted to directly attach to and communicate with a PLC type of field master through the interface portion.

2. The input/output body of claim 1 wherein each communications adapter is configured to directly attach to and communicate through the in-data port, the out-data port, and the identification port, and wherein each communications adapter is also configured to communicate with one or more types of field masters.

3. The input/output body of claim 2 wherein the communications adapter comprises:

an input multiplexer for accepting data from the in-data port and from the identification port;

an output multiplexer for providing data to the out-data port;

a processor for communicating with the input multiplexor and the output multiplexor, and for converting the data, received from the input multiplexor and the output multiplexor, to and from a format which is compatible with the communications protocol of a field bus upon which the field master resides; and, field bus circuitry connected between the processor and the field bus for allowing the processor to communicate with the field master on the field bus.

4. The input/output body of claim 2 wherein the communications adapter comprises means for accepting data from the in-data port and from the identification port, for providing data to the out-data port, and for converting the data to and from a format which is compatible with the communications protocol of a PLC type of field master.

5. The input/output body of claim 1 wherein the PLC type of field master is configured to communicate with the in-data port, the out-data port, and the identification port.

6. The input/output body of claim 1 wherein the interface portion further comprises a clock port for clocking the data.

7. The input/output body of claim 1 wherein the interface portion further comprises a latch port for latching the data.

8. The input/output body of claim 1 wherein the interface portion further comprises a clearout port for clearing the data in the out-data registers.

9. A transfer body for interfacing between field devices and a field master, the body comprising:

a plurality of transfer registers for communicating data relating to the field devices;

an identification register for identifying the data relating to the field devices; and, an interface portion having an identification port communicating with the identification register, a transfer port communicating with transfer registers, the body being adapted to directly attach to and communicate with a plurality of different types of communications adapters through the interface portion for communication with a field master, the body also being adapted to directly attach to and communicate with a PLC type of field master through the interface portion.

10. The transfer body of claim 9 wherein each communications adapter is configured to directly attach to and communicate through the transfer port and the identification port, and wherein each communications adapter is also configured to communicate with one or more types of field masters.

11. The transfer body of claim 10 wherein the communications adapter comprises:

a transfer multiplexer for communicating data with the transfer port and with the identification port;

a processor for communicating with the transfer multiplexor, and for converting the data, communicated with transfer multiplexor, to and from a format which is compatible with the communications protocol of a field bus upon which the field master resides; and, means connected between the processor and the field bus for allowing the processor to communicate with the field master on the field bus.

12. The transfer body of claim 10 wherein the communications adapter comprises means for communicating data with the transfer port and with the identification port, and for converting the data to and from a format which is compatible with the communications protocol of a PLC type of field master.

13. The transfer body of claim 9 wherein the PLC type of field master is configured to communicate with the transfer port and the identification port.

14. The transfer body of claim 9 wherein the interface portion further comprises a clock port for clocking the data.

15. The transfer body of claim 1 wherein the interface portion further comprises a latch port for latching the data.

16. The transfer body of claim 1 wherein the interface portion further comprises a clearout port for clearing the data in the out-data registers.

17. An data transfer/interface system for interfacing between field devices and a field master, the system comprising:

a transfer body having a plurality of transfer registers for communicating data relating to field devices, and an identification register for identifying the data relating to the field devices;

an interface portion having an identification port communicating with the identification register, a transfer port communicating with the transfer registers, wherein the transfer body is adapted to directly attach to and communicate with a PLC type of field master through the interface portion;

a communications adapter removably attached to the transfer body through the transfer port and the identification port, wherein the communications adapter is configured to communicate with a specific type of field master.

18. The system of claim 17 wherein the communications adapter comprises:

a transfer multiplexer for communicating data with the transfer port and with the identification port;

a processor for communicating with the transfer multiplexor, and for converting the data, communicated with transfer multiplexor, to and from a format which is compatible with the communications protocol of a field bus upon which the field master resides; and, means, connected between the processor and the field bus, for allowing the processor to communicate with the field master on the field bus.

19. The system of claim 17 wherein the communications adapter comprises means for communicating data with the transfer port and with the identification port, and for converting the data to and from a format which is compatible with the communications protocol of a PLC type of field master.

20. The system of claim 17 wherein the PLC type of field master is configured to communicate with transfer port and the identification port.

21. The system of claim 17 wherein the interface portion further comprises a clock port for clocking the data.

22. The system of claim 17 wherein the interface portion further comprises a latch port for latching the data.

23. The system of claim 17 wherein the interface portion further comprises a clearout port for clearing the data in the out-data registers.

* * * * *

UNITED STATES PATENT AND TRADEMARK OFFICE
CERTIFICATE OF CORRECTION

PATENT NO. : 6,016,523
DATED : January 18, 2000
INVENTOR(S) : Zimmerman et al.

It is certified that errors appear in the above-identified patent and that said Letters Patent is hereby corrected as shown below:

Column 1, Line15, after "between" delete "in"

Column 2, Line 48, change "cane" to - - can - -

Column 4, Line 22, after "order" insert - - to - -

Column 4, Line 36 after "port" delete "ion"

Column 6, Line 32, after "port" delete " ion"

Column 6, Line 54, after "port" delete "ion"

Column 11, Line 52, in "1,28" delte "," and insert - - . - -

Column 16, Line 14, delete "n" on word "An"

Column 10, Line 28, after "depict" delete "the"

Signed and Sealed this

Twenty-fourth Day of April, 2001

Attest:

NICHOLAS P. GODICI

Attesting Officer

Acting Director of the United States Patent and Trademark Office